(12) United States Patent
Dunbar et al.

(10) Patent No.: US 6,841,079 B2
(45) Date of Patent: Jan. 11, 2005

(54) FLUOROCHEMICAL TREATMENT FOR SILICON ARTICLES

(75) Inventors: Timothy D. Dunbar, Woodbury, MN (US); Lawrence A. Zazzera, Edina, MN (US); Mark J. Pellerite, Woodbury, MN (US); Larry D. Boardman, Woodbury, MN (US); George G. Moore, Afton, MN (US); Miguel A. Guerra, Woodbury, MN (US); Cheryl L. Elsbernd, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 163 days.

(21) Appl. No.: 10/160,738

(22) Filed: May 31, 2002

(65) Prior Publication Data

US 2003/0226818 A1 Dec. 11, 2003

(51) Int. Cl.⁷ .................................................. B81C 1/00
(52) U.S. Cl. .............................. 216/2; 216/11; 216/99; 427/255.6; 427/582; 427/585; 427/301; 427/309
(58) Field of Search .............................. 216/2, 11, 99; 427/255.6, 582, 585, 301, 309

(56) References Cited

U.S. PATENT DOCUMENTS

| | | |
|---|---|---|
| 2,559,628 A | 7/1951 | Joyce Jr. |
| 2,666,797 A | 1/1954 | Husted et al. |
| 2,809,990 A | 10/1957 | Brown |
| 3,293,306 A | 12/1966 | Le Bleu et al. |
| 3,574,770 A | 4/1971 | Paine et al. |
| 4,094,911 A | 6/1978 | Mitsch et al. |
| 4,156,791 A | 5/1979 | Childs |
| 4,510,094 A | 4/1985 | Drahnak |
| 4,530,879 A | 7/1985 | Drahnak |
| 4,603,215 A | 7/1986 | Chandra et al. |
| 4,670,531 A | 6/1987 | Eckberg |
| 4,916,169 A | 4/1990 | Boardman et al. |
| 5,011,963 A | 4/1991 | Ogawa et al. |
| 5,017,540 A | 5/1991 | Sandoval et al. |
| 5,145,886 A | 9/1992 | Oxman et al. |
| 5,233,071 A * | 8/1993 | Wilczek ...................... 556/479 |
| 5,266,650 A | 11/1993 | Guerra et al. |
| 5,326,738 A | 7/1994 | Sandoval et al. |
| 5,384,374 A | 1/1995 | Guerra et al. |
| 5,429,708 A * | 7/1995 | Linford et al. ................. 216/66 |
| 5,437,812 A | 8/1995 | Janulis et al. |
| 5,476,974 A | 12/1995 | Moore et al. |
| 5,488,142 A | 1/1996 | Fall et al. |
| 5,512,374 A | 4/1996 | Wallace et al. |
| 5,520,978 A | 5/1996 | Boardman et al. |
| 5,578,278 A | 11/1996 | Fall et al. |
| 5,851,674 A | 12/1998 | Pellerite et al. |
| 5,908,692 A | 6/1999 | Hamers et al. |
| 6,046,250 A | 4/2000 | Boardman et al. |
| 6,114,044 A | 9/2000 | Houston et al. |
| 6,132,801 A | 10/2000 | Linford |
| 6,277,485 B1 | 8/2001 | Invie et al. |
| 6,284,317 B1 | 9/2001 | Laibinis et al. |
| 6,310,018 B1 | 10/2001 | Behr et al. |
| 2002/0160139 A1 | 10/2002 | Huang et al. |
| 2002/0164879 A1 | 11/2002 | Leung et al. |

FOREIGN PATENT DOCUMENTS

| | | |
|---|---|---|
| EP | 0 606 640 A1 | 7/1994 |
| EP | 0 689 076 A1 | 12/1995 |
| WO | WO 97/11484 | 3/1997 |
| WO | WO 99/37409 | 7/1999 |
| WO | WO 00/33976 | 6/2000 |
| WO | WO 01/30873 A1 | 5/2001 |

OTHER PUBLICATIONS

Rong et al., "The Addition of Perfluorobutyl Iodide to Carbon–Carbon Multiple Bonds and the Preparation of Perfluorobutylalkenes", Tetrahedron Letters, vol. 31, No. 39, pp. 5615–5616, 1990.

Ashurst et al., "Alkene based monolayer films as anti–stiction coatings for polysilicon MEMS", ELSEVIER, Sensors and Actuators, A 91, pp. 239–248, 2001.

Ashurst et al., "Alkene Based Monolayer Films as Anti–stiction Coatings for Polysilicon MEMS", Solid–State Sensor and Actuator Workshop, Hilton Head Island, SC, Jun. 4–8, 2000.

Linford et al., "Alkyl Monolayers Covalently Bonded to Silicon Surfaces", J. Am. Chem. Soc., vol. 115, pp. 12631–12632, 1993.

Linford et al., "Alkyl Monolayers on Silicon Prepared from 1–Alkenes and Hydrogen–Terminated Silicon", J. Am. Chem. Soc., vol. 117, pp. 3145–3155, 1995.

Srinivasan et al., "Alkyltrichlorosilane–Based Self–Assembled Monolayer Films for Stiction Reduction in Silicon Micromachines", Journal of Microelectromechanical Systems, vol. 7, No. 2, pp. 252–260, Jun. 1998.

Zazzera et al., "Bonding Organic Molecules to Hydrogen–Terminated Silicon Wafers", J. Electrochem. Soc., vol. 144, No. 6, pp. 2184–2189, Jun. 1997.

Zazzera et al., "Bonding Organic Molecules to H–Terminated Silicon Wafers", Electrochemical Society Proceedings, vol. 95–27, 1995.

(List continued on next page.)

*Primary Examiner*—Anita Alanko

(57) ABSTRACT

Silicon substrates having Si—H bonds are chemically modified using a fluorinated olefin having the formula:

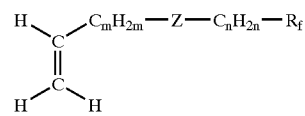

wherein
m is an integer greater than or equal to 1;
n is an integer greater than or equal to 0;
Z is a divalent linking group; and
$R_f$ is a highly fluorinated organic group.

53 Claims, No Drawings

OTHER PUBLICATIONS

Lee et al., "Chemical, optical and tribological characterization of perfluoropolymer films as an anti–stiction layer in micro–mirror arrays", ELSEVIER, Thin Solid Films 377–378, pp. 727–732, 2000.

Mayer et al., "Chemical vapor deposition of fluoroalkylsilane monolayer films for adhesion control in microelectromechanical systems", J. Vac. Sci. Technol. B 18(5), pp. 2433–2440, Sep./Oct. 2000.

Laibinis et al., "Comparison of the Structures and Wetting Properties of Self–Assembled Monolayers of n–Alkanethiols on the Coinage Metal Surfaces, Cu, Ag, Au[1]", J. Am. Chem. Soc., vol. 113, pp. 7152–7167, 1991.

Villeneuve et al., "Electrochemical Formation of Close–Packed Phenyl Layers on Si(111)", J. Phys. Chem. B, vol. 101, pp. 2415–2420, 1997.

Wade et al., "Etch–pit initiation by dissolved oxygen on terraces of H–Si(111)", Appl. Phys. Lett. 71(12), pp. 1679–1681, 1997.

Bunker et al., "The Impact of Solution Agglomeration on the Deposition of Self–Assembled Monolayers", Langmuir, vol. 16, pp. 7742–7751, 2000.

Sieval et al., "An Improved Method for the Preparation of Organic Monolayers of 1–Alkenes on Hydrogen–Terminated Silicon Surfaces", Langmuir, vol. 15, pp. 8288–8291, 1999.

Lee et al., "Light–Induced Reactions of Porous and Single–Crystal Si Surfaces with Carboxylic Acids", J. Am. Chem. Soc., vol. 118, pp. 5375–5382, 1996.

Henck, "Lubrication of digital micromirror devices™", Tribology Letters 3, pp. 239–247, 1997.

Zhu et al., "Molecular lubricants for silicon–based microelectromechanical systems (MEMS): a novel assembly strategy", Tribology Letters 7, pp. 87–90, 1999.

Sieval et al., "Molecular Modeling of Covalently Attached Alkyl Monolayers on the Hydrogen–Terminated Si(111) Surface", Langmuir, vol. 17, pp. 2172–2181, 2001.

Niederhauser et al., "A New Method of Preparing Monolayers on Silicon and Patterning Silicon Surfaces by Scribing in the Presence of Reactive Species", Langmuir, vol. 17, pp. 5889–5900, 2001.

Boukherroub et al., "New Synthetic Routes to Alkyl Monolayers on the Si(111) Surface", Langmuir, vol. 15, pp. 3831–3835, 1999.

Jun et al., "Novel Chemistry for Surface Engineering in MEMS", In Materials and Device Characterization in Micromachining III, Yuli Vladimersky, Philip J. Coane, Editors, Proceedings of SPIE, vol. 4175, 2000.

Effenberger et al., "Photoactivated Preparation and Patterning of Self–Assembled Monolayers with 1–Alkenes and Aldehydes on Silicon Hydride Surfaces", Angew. Chem. Int. Ed., vol. 37, No. 18, pp. 2462–2464, 1998.

Cicero et al., "Photoreactivity of Unsaturated Compounds with Hydrogen–Terminated Silicon(111)", Langmuir, vol. 16, pp. 5688–5695, 2000.

Thorpe et al., "Poly(methylpropenoxyfluoroalkylsiloxane)s: a class of fluoropolymers capable of inhibiting bacterial adhesion onto surfaces", ELSEVIER, Journal of Fluorine Chemistry, vol. 104, pp. 37–45, 2000.

Srinivasan et al., "Self–Assembled Fluorocarbon Films For Enhanced Stiction Reduction", TRANSOURCERS '97, 1997 International Conference on Solid–State Sensors and/Actuators, pp. 1399–1402, Chicago, Jun. 16–19, 1997.

Maboudian et al., "Self–assembled monolayers as anti–stiction coatings for MEMS: characteristics and recent developments", ELSEVIER, Sensors and Actuators 82, pp. 219–223, 2000.

Brzoska et al., "Silanization of Solid Substrates: A Step toward Reproducibility", Langmuir, vol. 10, pp. 4367–4373, 1994.

Maboudian et al., "Stiction reduction processes for surface micromachines", Tribology Letters 3, pp. 215–221, 1997.

Barrelet et al., "Surface Characterization and Electrochemical Properties of Alkyl, Fluorinated Alkyl, and Alkoxy Monolayers on Silicon", Langmuir, vol. 17, pp. 3460–3465, 2001.

Thorpe et al., "Surface energy characteristics of poly(methylpropenoxyfluoroalkylsiloxane) film structures", ELSEVIER, Applied Surface Science 136, pp. 99–104, 1998.

LaZerte et al., "The Free–radical Catalyzed Addition of Alcohols and Aldehydes to Perfluoroolefins", J. Am. Chem. Soc., vol. 77, pp. 910–914 (1955).

Koester et al., MUMPs® Design Handbook, Revision 7.0, JDS Uniphase, MEMs Business Unit, 2001.

* cited by examiner

FLUOROCHEMICAL TREATMENT FOR SILICON ARTICLES

TECHNICAL FIELD

The present invention relates generally to chemical modification of silicon substrates, and more specifically to chemical modification of silicon-based microelectromechanical systems (i.e., MEMS) devices.

BACKGROUND

MEMS devices are used, for example, as airbag accelerometers, microengines, optical switches, gyroscopic devices, sensors, and actuators. MEMS devices are typically manufactured from a silicon wafer using microlithography, and have freestanding active silicon elements (e.g., gears, hinges, levers, slides, and mirrors) that must be free to move, rotate, etc. The inherent mechanical nature of MEMS devices brings about a high and ever increasing level of complexity to their production and reliability.

MEMS devices generally have large surface-area-to-volume ratios, and thus their performance is often dominated by strong adhesion (i.e., stiction) of active silicon elements to one another and/or to the supporting silicon substrate. Stiction may be caused by capillary forces (e.g., resulting from high critical surface tension of silicon surfaces of MEMS devices), electrostatic forces, van der Waals forces, and/or "chemical" forces such as hydrogen bonding and solid bridging. Stiction may occur, for example, during release of MEMS elements from via etching, or at a later time (e.g., during use).

Stiction, friction, and wear are major problems limiting both the production yield and useful lifetime of many MEMS devices, and have plagued the MEMS industry since its inception.

To address the problem of stiction, various treatments that reduce stiction (i.e., anti-stiction treatments) are commonly employed. Such treatments typically reduce capillary forces by reducing the surface energy of MEMS surfaces (e.g., resulting in a high advancing and/or receding contact angle with water). Ideally, anti-stiction treatments are stable at typical operating temperatures of MEMS devices (e.g., in the range of from −40 to +130° C.). In some cases, an anti-stiction treatment may also serve to lubricate moving MEMS elements, thereby ensuring proper function and reducing the rate of wear.

Many anti-stiction and/or lubrication treatments are mere liquid coatings, and thus prone to loss or removal over time. Other anti-stiction treatments utilize various grafting techniques to chemically bond an anti-stiction coating to silicon surfaces of the MEMS device. However, and notwithstanding any reduction in stiction that may be achieved by such methods, there continues to be a need for further improvements in anti-stiction treatments.

SUMMARY OF THE PRESENT INVENTION

In one aspect, the present invention provides a method for modifying a silicon substrate comprising:

providing a silicon substrate having a plurality of Si—H bonds;

providing a composition comprising:

a fluorinated olefin having the formula:

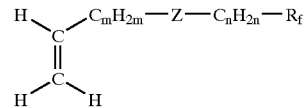

wherein
m is an integer greater than or equal to 1,
n is an integer greater than or equal to 0,
Z is a divalent linking group,
$R_f$ is a highly fluorinated organic group, and optional solvent; and contacting the composition with the silicon substrate under conditions such that the fluorinated olefin becomes covalently attached to the surface of the silicon substrate.

In another aspect, the present invention provides an article comprising a chemically modified silicon substrate prepared according to a method comprising:

providing a silicon substrate;
etching the silicon substrate to form a plurality of Si-H bonds;
providing a composition comprising:
a fluorinated olefin having the formula:

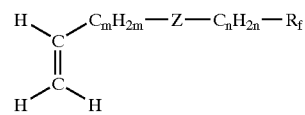

wherein
m is an integer greater than or equal to 1,
n is an integer greater than or equal to 0,
Z is a divalent linking group,
$R_f$ is a highly fluorinated organic group, and optional solvent; and contacting the composition with the silicon substrate under conditions such that the fluorinated olefin becomes covalently attached to the silicon substrate.

In another aspect, the present invention provides an article comprising a chemically modified silicon substrate, wherein the chemically modified substrate comprises at least one silicon atom that is covalently bonded to an organic group having the formula:

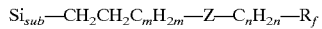

$$Si_{sub}-CH_2CH_2C_mH_{2m}-Z-C_nH_{2n}-R_f$$

wherein m is an integer greater than or equal to 1;
n is an integer greater than or equal to 0;
Z is a divalent linking group;
$R_f$ is a highly fluorinated organic group; and
$Si_{sub}$ is a substrate silicon atom directly bonded to at least one additional substrate silicon atom.

Surface-modified silicon substrates prepared according to the present invention exhibit outstanding properties (e.g., hydrophobicity and/or oleophobicity). The methods and materials of the present invention have applicability to the fabrication of a broad range of silicon-based articles, especially regarding MEMS devices, where they provide useful anti-stiction coatings.

DETAILED DESCRIPTION

The present invention concerns materials and methods for modifying a silicon substrate having chemically accessible Si—H bonds. Modification is achieved by hydrosilylation of the Si—H bonds with at least one fluorinated olefin. In hydrosilylation, a Si—H bond is added across a terminal carbon-carbon double bond of an olefin, typically attaching a silicon atom to the terminal carbon atom of the olefin. Modification of the silicon substrate typically occurs at its surface, although modification may also occur within the body of the silicon substrate in region(s) that are chemically accessible (e.g., as in the case of a porous silicon substrate).

Silicon-hydride (i.e., Si—H) bonds may be formed on a silicon substrate, for example, by treating an oxidized silicon surface with an etching agent. Suitable etching agents, acidic or basic, are widely known and may be used to prepare hydrogenated silicon surfaces, suitable for use in practicing the present invention, having up to about 3 hydrides per silicon atom depending on the etching agent(s) used.

Exemplary acidic etching agents that result in various silicon hydrides on the silicon substrate surface include 40 percent by weight aqueous ammonium fluoride; aqueous hydrofluoric acid; and anhydrous hydrofluoric acid etch cleaning compositions such as those described, for example, in U.S. Pat. No. 6,310,018 (Behr et al.), the disclosure of which is incorporated herein by reference.

In an exemplary basic method, aqueous base (e.g., sodium hydroxide) can be used as an etching agent to provide a hydrogenated silicon surface.

The etching duration, etching agent concentration, and temperature are generally interrelated. Typically, the etching agent concentration ranges from about 27 molar to about 12 molar, temperatures of the etching process range from about 18 to about 30° C., and the duration of the etching ranges from about 1 to about 5 minutes (min), although other concentrations, temperatures, and etching durations may be used.

Subsequent to etching, the substrate is desirably handled under an inert atmosphere (e.g., nitrogen or argon) in order to prevent conversion of the Si—H bonds to Si—O bonds.

Once a silicon substrate has been etched to form a surface having Si—H bonds, the fluorinated olefin, whether present as a mixture, in solution, or in pure form is applied to the silicon substrate such that the fluorinated olefin comes into contact with Si—H bonds (e.g., on an exposed surface of the silicon substrate).

Useful silicon substrates include any form of solid silicon. Exemplary silicon substrates include polycrystalline silicon (i.e., polysilicon), silicon nanocrystals, amorphous silicon, porous silicon, thin films of any of these forms of solid silicon, and/or combinations thereof. The silicon substrate may have any shape. Desirably, the silicon substrate is planar. More desirably, the substrate has the form of a wafer or a chip.

In some embodiments, the silicon substrate may comprise one or more microelectromechanical elements (e.g., a MEMS device). Exemplary MEMS devices include accelerometers; pressure, mass flow, and yaw rate sensors; displays; optical scanners; adaptive optics; optical modulators; optical attenuators; dynamic gain equalizers; optical, microwave, and radio frequency switches; tunable capacitors and inductors; micro-relays; chemical sensors; and micro-valves.

MEMS devices may be fabricated, for example, by commercially known methods such as those available from JDS Uniphase MEMS Business Unit (Cronos), Research Triangle Park, N.C.; Sandia National Laboratories, Albuquerque, N. Mex.; or Tronic's Microsystems, Grenoble, France. An exemplary assembly procedure is described in "MUMPs Design Handbook", revision 7.0 (2001), available from JDS Uniphase MEMS Business Unit (Cronos), the disclosure of which is incorporated herein by reference.

Methods and articles according to the present invention are useful for additional applications beyond MEMS device anti-stiction treatments (e.g., stabilization of porous silicon, preparation of stable Si electrodes, silicon surface passivation, immobilization of DNA on Si, and in manufacture of microfluidic devices).

The fluorinated olefin, useful for practicing the present invention, includes at least one material having the formula:

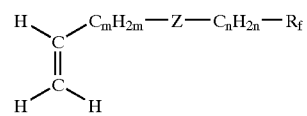

wherein m, n, Z, and $R_f$ are defined as follows:

m is an integer greater than or equal to 1, desirably in the range of from about 1 to about 20, more desirably in the range of from about 1 to about 10. In some desired embodiments, m is about 1. Without wishing to be bound by theory, it is believed that the presence of one or more methylene groups (i.e., m greater than or equal to 1) provides enhanced reactivity to the fluorinated olefin as compared with electron withdrawing groups such as perfluoroalkyl or perfluoroalkylene, and provides enhanced chemical and environmental stability as compared with strong electron donating groups such as alkoxy, dialkylamino, and the like.

n is an integer greater than or equal to 0, desirably in the range of from about 0 to about 20, more desirably in the range of from about 0 to about 3.

Z is a covalent bond or a divalent linking group, including, for example, straight chain, branched chain or cyclic alkylene; arylene; straight chain, branched chain, or cyclic aralkylene; oxygen; carbonyl; sulfur; sulfonyl; amino (including substituted amino, for example, alkylamino); and combinations thereof such as, for example, sulfonamido, carboxamido, carbonyloxy, oxycarbonyl, alkyleneoxy, sulfonamidoalkylene, carboxamidoalkylene, or poly (oxyalkylene). Desirably, Z is a covalent bond, —O—, or

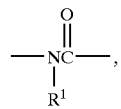

wherein $R^1$ is alkyl (e.g., methyl, ethyl) or H. More desirably, Z is —O— or

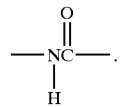

$R_f$ is a highly fluorinated organic group. As used herein, the term "highly fluorinated organic group" means an organic group comprising at least about 3 carbon atoms and containing fluorine in an amount greater than or equal to about 40 percent by weight. Desirably, $R_f$ contains fluorine in an amount greater than or equal to about 50 percent by weight, more desirably in an amount greater than or equal to about 60 percent by weight. $R_f$ may be, for example, branched, straight chain (i.e., not branched), and/or cyclic. $R_f$ may be, for example, a fluorine-substituted alkyl, alkaryl, aralkyl, or aryl group, optionally substituted with one or more additional groups including, for example, oxa, alkoxy, and allyloxy groups.

In some embodiments, $R_f$ may comprise an alkyl, alkylene, alkoxyalkyl group, and/or a derivative thereof that is at least partially fluorinated. In some embodiments, $R_f$ has from about 4 to about 30 carbon atoms, although other numbers of carbon atoms are also useful. Desirably, $R_f$ comprises one or more perfluoroalkyl and/or perfluoroalkylene groups. Exemplary perfluoroalkyl groups include trifluoromethyl, pentafluoroethyl, perfluoropropyl (e.g., perfluoroisopropyl), perfluorobutyl (e.g., perfluoro-n-butyl, perfluoroisobutyl, perfluoro-tert-butyl), perfluorooctyl (e.g., perfluoro-n-octyl, perfluoroisooctyl), and perfluorodecyl. Desirably, perfluoroalkyl groups have from about 4 to about 12 carbon atoms. Exemplary perfluoroalkylene groups include hexafluoropropylene, octafluorobutylene, and dodecafluorohexylene.

In some embodiments, $R_f$ may comprise a poly (alkyleneoxy) group and/or partially or fully fluorinated derivative thereof. Exemplary perfluorinated polyalkyleneoxy groups include poly(tetrafluoroethyleneoxy) groups; mono- and divalent poly(hexafluoropropyleneoxy) groups; and groups consisting of block or randomly arranged difluoromethyleneoxy, tetrafluoroethyleneoxy, and hexafluoropropyleneoxy groups (e.g., poly(tetrafluoroethyleneoxy-co-hexafluoropropyleneoxy) groups).

The fluorinated olefin, useful in practice of the present invention, may be obtained, for example, directly from a commercial supplier and/or prepared by known method(s), the choice typically depending on the specific nature of m, n, Z, and $R_f$.

In some embodiments of the present invention, the fluorinated olefin comprises at least one fluorinated allyl amide, desirably having the formula:

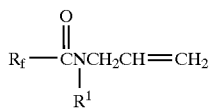

wherein $R_f$ and $R^1$ are as defined hereinabove. Such compounds may typically be prepared by reaction of a fluorinated ester, for example, having the formula RfC(O)OCH3, with excess allylamine to form the corresponding allylamide in a manner as described, for example, in the Examples presented hereinbelow.

In some embodiments of the present invention, the fluorinated olefin comprises at least one fluorinated allyl ether, desirably having the formula:

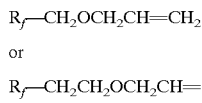

wherein $R_f$ is a highly fluorinated organic group as defined hereinabove. Such compounds may be prepared by allylating a fluorinated alcohol, for example, having the formula $R_fCH_2OH$ or $R_fCH_2CH_2OH$. Typically, such fluorinated alcohols may be allylated (e.g., with excess allyl bromide) to form the corresponding allyl ethers in a manner as described, for example, in the Examples presented hereinbelow.

Typically, fluorinated alcohols (e.g., having the formula $R_fCH_2OH$ or $R_fCH_2CH_2OH$) may be obtained directly from a commercial supplier and/or prepared, for example, by reduction of the corresponding carboxylic acid with lithium aluminum hydride or by catalytic hydrogenation over a copper-chromium oxide catalyst (e.g., as described in U.S. Pat. No. 2,666,797 (Husted et al.), the disclosure of which is incorporated herein by reference); by sodium borohydride reduction of the methyl ester of the corresponding fluorinated carboxylic acid (as described, for example, in U.S. Pat. No. 4,156,791 (Childs), the disclosure of which is incorporated herein by reference); by sodium borohydride reduction of the corresponding fluorinated carboxylic acid halide (e.g., as described in U.S. Pat. No. 3,293,306 (Bleu et al.) and U.S. Pat. No. 3,574,770 (Stump et al.), the disclosures of which are incorporated herein by reference); by free-radical addition of methanol to perfluoroolefins (e.g., $CF_3CF=CF_2$ and $C_5F_{11}CF=CF_2$, as described, for example, by LaZerte and Koshar in J. Am. Chem. Soc., vol. 77, p. 910 (1955), the disclosure of which is incorporated herein by reference); by free-radical telomerization of tetrafluoroethylene with methanol (e.g., as described in U.S. Pat. No. 2,559,628 (Joyce), the disclosure of which is incorporated herein by reference), and/or by direct fluorination of the corresponding acetate of a hydrocarbon alcohol (e.g., as described in U.S. Pat. No. 5,488,142 (Fall et al.), the disclosure of which is incorporated herein by reference), and subsequent hydrolysis.

Exemplary useful commercially available fluorinated alcohols include substituted and unsubstituted 1H,1H-dihydroperfluoroalkan-1-ols (e.g., 2,2,3,3-tetrafluoro-1,4-butanediol; 1H,1H,3H-tetrafluoro-1-propanol; 1H,1H-pentafluoro-1-propanol; 2,2,3,3,4,4-hexafluoro-1,5-pentanediol; 1H,1H-heptafluoro-1-butanol; 1H,1H,6H,6H-octafluorohexanediol; 1H,1H,5H-octafluoro-1-pentanol; undecafluorocyclohexylmethanol; 1H,1H,7H-dodecafluoro-1-heptanol; 1H,1H-pentadecafluorooctan-1-ol; 1H,1H,9H-hexadecafluoro-1-nonanol; and 1H,1H,11H-eicosafluoro-1-undecanol); perfluoropolyetherdiols having a number average molecular weight of from about 1,200 to about 14,000 grams/mole (g/mole), such as, for example, those having the trade designation "FOMBLIN" (e.g., "FOMBLIN Z DOL 2000", "FOMBLIN Z DOL 2500", "FOMBLIN Z DOL 4000", "FOMBLIN Z DOL TX", "FOMBLIN Z TETRAOL", "FOMBLIN AM 2001", "FOMBLIN AM 3001"), commercially available from Ausimont USA, Thorofare, N.J.).

In some embodiments of the present invention, the fluorinated olefin desirably comprises a poly (perfluoroalkyleneoxy) group.

In some embodiments of the present invention, the fluorinated olefin desirably comprises a perfluoroalkanesulfonamido group such as, for example, a perfluorobutanesulfonamido or perfluorooctanesulfonamido group.

The fluorinated olefin may be present, for example, as a mixture (e.g., a dispersion in solvent), in solution in solvent, or in pure form, and may optionally be present in combination with, for example, a hydrosilylation catalyst and/or a free-radical initiator as described hereinbelow.

Solvent that may, optionally, be used in conjunction with the fluorinated olefin, according to the present invention, may comprise one or more compounds that are liquid at 20° C. Desirably, solvent should be inert (i.e., substantially free of functional groups that would interfere with the hydrosilylation reaction). Exemplary suitable compounds that may constitute solvent include alkanes (e.g., dodecane, hexadecane, isoundecane), hydrofluoroethers (e.g., those marketed by 3M Company under the trade designations "3M NOVEC ENGINEERED FLUID HFE-7100", "3M NOVEC ENGINEERED FLUID HFE-7500", "3M NOVEC ENGINEERED FLUID HFE-7200"), chlorofluorocarbons (e.g., $CF_2ClCFCl_2$), and perfluorinated trialkylamines (e.g., that marketed by 3M Company under the trade designation "3M FLUORINERT ELECTRONIC FLUID FC-70"). Desirably, optional solvent is chosen such that the fluorinated olefin and other optional components is/are soluble, at ambient temperature and at the concentrations utilized.

Suitable methods of applying the fluorinated olefin and any other optional components (e.g., hydrosilylation catalyst, free-radical initiator, and/or solvent) to the silicon substrate include, for example, spraying, dip coating, wiping, and spin coating. In some embodiments of the present invention (e.g., if the silicon substrate comprises a MEMS device), hydrosilylation is desirably carried out utilizing a solution of the fluorinated olefin in solvent. In such cases, the fluorinated olefin is typically present in an amount of from about 0.05 to about 20 percent by weight based on the total weight of solution, although other percentages are possible.

In some embodiments (e.g., thermal hydrosilylation of a silicon substrate with a volatile fluorinated olefin), as an alternative to the aforementioned application methods, the fluorinated olefin in vapor form may be brought into contact with the silicon substrate under conditions wherein hydrosilylation can occur. Desirably, in such embodiments the fluorinated olefin consists essentially of a single fluorinated olefin, although mixtures can be used. Such technique may be especially desirable, if utilizing a fluorinated olefin that is prone to secondary reactions (e.g., polymerization) under hydrosilylation conditions.

After coating the silicon substrate, but prior to hydrosilylation, optional solvent that is present may, optionally, be removed (e.g., by evaporation).

Typically, the fluorinated olefin is applied as a layer to at least a portion, desirably all, of the substrate surface to be treated. Desirably, the fluorinated olefin forms a monolayer (e.g., a self-assembled monolayer) on the surface of the silicon substrate. As a surface treatment for a silicon substrate, the layer of the fluorinated olefin may be of any thickness, but for MEMS device applications, the layer of the fluorinated olefin, after reaction with the silicon substrate and removal of optional solvent, typically has a thickness in the range of from about 0.5 to about 10 nanometers (nm), desirably in the range of from about 1 to about 5 nm, more desirably in the range of from about 1 to about 2.5 nm.

Hydrosilylation of the fluorinated olefin with substrate Si—H groups (e.g., $Si_{sub}$—H, see below) typically, and desirably, results in a chemically modified silicon substrate, wherein the chemically modified substrate comprises at least one silicon atom that is covalently bonded to an organic group having the formula:

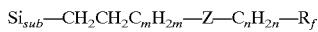

wherein m, n, Z, and $R_f$ are as previously defined, and $Si_{sub}$ represents a substrate silicon atom directly bound (e.g., coordinated) to at least one and typically three additional substrate silicon atoms.

Desirably, hydrosilylation of the fluorinated olefin with $Si_{sub}$—H groups results in chemical modification of the entire surface (e.g., by formation of a layer of organic material) of the silicon substrate, although partial coverage can also be useful. Desirably, the thickness of the layer of organic material corresponds to the length of a single olefin molecule (i.e., a monolayer), although thicker layers of organic material (e.g., resulting from secondary reactions of the fluorinated olefin or other components) are also typically useful.

Hydrosilylation may proceed spontaneously or a catalyst, free-radical initiator (e.g., free-radical photoinitiator), and/or energy may be utilized. Exemplary forms of energy include thermal energy and/or electromagnetic radiation (for example, having a wavelength in the range of about 200 to about 400 nm). Typically, heating a silicon substrate having surface Si-H bonds at temperatures up to about 180° C. or more, in the presence of a fluorinated olefin (e.g., fluorinated allyl ether), for a period of minutes to several hours (hr) (e.g., 3 hr), or even longer, is an effective means of carrying out the hydrosilylation reaction. Under such conditions, a high boiling solvent (e.g., having a boiling point of greater than or equal to about 180° C.) may desirably be used with the fluorinated olefin. Further, under such conditions it is desirable that the fluorinated olefin is neither thermally unstable nor volatile at the temperatures utilized. Otherwise, it may decompose or evaporate before it can react with surface Si-H bonds of the silicon substrate.

While not required, in some embodiments of the invention at least one of a hydrosilylation catalyst and/or a free-radical initiator (e.g., a free-radical photoinitiator) may be utilized to facilitate reaction of the fluorinated olefin with Si—H bonds. Desirably, the hydrosilylation catalyst and/or the free-radical initiator, if present, is/are in solution with the fluorinated olefin and any optional solvent.

Hydrosilylation catalyst may include, for example, one or more of a precious metal-containing hydrosilylation catalyst (e.g., chloroplatinic acid, platinum deposited on a substrate, platinum complexed with an organic ligand (e.g., alcohol, aldehyde), and/or a rhodium halide complex). In some embodiments, hydrosilylation catalyst can be a hydrosilylation photocatalyst (i.e., a hydrosilylation catalyst precursor that is activated by exposure to electromagnetic radiation to form a hydrosilylation catalyst). Typically, useful electromagnetic radiation has at least one wavelength in the range of, for example, from about 200 to about 700 nm, although other wavelengths may be used. Useful photocatalysts include, for example: platinum azo complexes, as described, for example, in U.S. Pat. No. 4,670,531 (Eckberg); ($\eta^4$-cyclooctadiene)diarylplatinum complexes as described, for example, in U.S. Pat. No. 4,530,879 (Drahnak); platinum alkyne complexes as described, for example, in U.S. Pat. No. 4,603,215 (Chandra et al.); ($\eta^5$-cyclopentadienyl) trialkylplatinum complexes as described, for example, in U.S. Pat. No. 4,510,094 (Drahnak) and U.S. Pat. No. 4,916,169 (Boardman et al.); platinum acetylacetonate complexes as described, for example, in U.S. Pat. No. 5,145,886 (Oxman et al.), the disclosures of which are incorporated herein by reference.

Hydrosilylation catalyst, if utilized, is typically present in an effective amount, e.g., in an amount ranging from about 1 to about 1000 parts by weight of hydrosilylation catalyst per one million parts by weight of the fluorinated olefin, desirably from about 10 to about 200 parts by weight hydrosilylation catalyst, per one million parts of the fluorinated olefin, although other amounts and ranges can be utilized.

Free-radical initiator generates free radicals that can abstract H-atoms from silicon hydride bonds upon exposure to heat or electromagnetic radiation. Free-radical initiator may include at least one free-radical thermal initiator and/or at least one photoinitiator. Exemplary free-radical thermal initiators include organic peroxides (e.g., benzoyl peroxide)

and azo compounds (e.g., 2,2'-azobisisobutyronitrile). Exemplary free-radical photoinitiators include one or more of benzoin and its derivatives (e.g. α-methylbenzoin, α-phenylbenzoin, α-allylbenzoin, α-benzylbenzoin), benzoin ethers such as benzil dimethyl ketal (available, for example, under the trade designation "IRGACURE 651", from Ciba Specialty Chemicals, Tarrytown, N.Y.), benzoin methyl ether, benzoin ethyl ether, and benzoin n-butyl ether; acetophenone and its derivatives such as 2-hydroxy-2-methyl-1-phenyl-1-propanone (available, for example, under the trade designation "DAROCUR 1173" from Ciba Specialty Chemicals) and 1-hydroxycyclohexyl phenyl ketone (available, for example, under the trade designation "IRGACURE 184" from Ciba Specialty Chemicals), 2-methyl-1-[4-(methylthio)phenyl]-2-(4-morpholinyl)-1-propanone (available, for example, under the trade designation "IRGACURE 907" from Ciba Specialty Chemicals), and 2-benzyl-2-(dimethylamino)-1-[4-(4-morpholinyl)phenyl]-1-butanone (available, for example, under the trade designation "IRGACURE 369" from Ciba Specialty Chemicals); and combinations thereof. In some embodiments, free-radical photoinitiator may be combined with a platinum complex, for example, a platinum complex having one diolefin group that is eta-bonded to the platinum atom as described, for example, in U.S. Pat. No. 6,046,250 (Boardman et al.), the disclosure of which is incorporated herein by reference.

Following hydrosilylation, reaction components including optional solvent, unreacted olefin, and optional catalyst or free-radical initiator may be removed from the substrate (e.g., by evaporation and/or rinsing, for example, with a volatile solvent or liquid or supercritical $CO_2$). Such removal of reaction components is highly desirable if the silicon substrate comprises a MEMS device.

The present invention will be more fully understood with reference to the following non-limiting examples in which all parts, percentages, ratios, and so forth, are by weight unless otherwise indicated.

EXAMPLES

"Room temperature" in the following preparations and examples means in the range of from approximately 20 to 24° C.

"Overnight" in the following preparations and examples means in the range of from approximately 14 to 16 hr.

Contact angles reported in Tables 1 and 2 were measured on the indicated surface modified silicon wafers using either deionized water (≧18 megohms, using a purification system, obtained under the trade designation "MILLI-Q" from Millipore Corp., Bedford, Mass.) or anhydrous hexadecane, using a video contact angle measuring system (having the trade designation "VCA-2500XE", obtained from AST Products, Inc., Billerica, Mass.). The reported contact angles are an average value of contact angle measurements taken from opposite sides of three different drops. Typical uncertainty in the reported values of advancing and receding contact angles are ±2° and ±4°, respectively.

Unless otherwise noted, all reagents used in the following preparations and examples were obtained, or are available, from general chemical suppliers such as Aldrich Chemical Co., Milwaukee, Wis., or may be synthesized by known methods.

Materials Used in the Examples $C_2F_5OC_2F_4OCF_2CH_2OH$ can be prepared as described in Example 3 of U.S. Pat. No. 5,437,812 (Janulis et al.), the disclosure of which is incorporated herein by reference.

"KRYTOX 157 FS(L)" is a trade designation for a fluorinated polyether having the formula $CF_3(CF_2)20[CF(CF_3)CF_2O]_xCF(CF_3)CO_2H$, and having a number average molecular weight $M_n$ of approximately 2,500 g/mole, obtained from E. I. du Pont de Nemours & Co., Wilmington, Del.

"FOMBLIN Z-DOL 2000" is a trade designation for fluorinated polyether having the formula $HOCH_2CF_2[(CF_2CF_2O)_q(CF_2O)_p]CF_2CH_2OH$, having a q to p ratio of 1 and having a number average molecular weight $M_n$ of approximately 2,000 g/mole, obtained from Ausimont USA.

$CF_3(CF_2)_3OC_2F_4OCF_2CH_2OC_2H_4OH$ can be prepared, for example, as described in Example 23 of U.S. Pat. No. 5,437,812 (Janulis et al.), the disclosure of which is incorporated herein by reference.

$CF_3(CF_2)_7CH=CH_2$ (99% purity), obtained from Aldrich Chemical Co., was used after drying over 4A molecular sieves.

1-Hexadecene (99% purity), obtained from ICN Biomedicals, Aurora, Ohio, was used after drying over 4A molecular sieves.

1-Eicosene (>85% purity) was obtained from ICN Biomedicals, and used as received.

$C_7F_{15}CH_2OH$ (a mixture of approximately 70 percent linear and 30 percent branched isomers) was obtained from 3M Company, St. Paul, Minn.

$CF_3(CF_2)_3(CH_2)_{10}CH_2OH$ was prepared according to the following method: To a mixture of 199.7 grams (g) of perfluoro-n-butyl iodide and 93.7 g of 10-undecen-1-ol in a mixture of 700 mL of acetonitrile and 300 mL of water was added a mixture of 53.8 g of sodium bicarbonate and 106.2 g of sodium dithionite in small portions with stirring. The reaction mixture was stirred at room temperature overnight and acidified with 1 N hydrochloric acid. The mixture was extracted with diethyl ether, and the combined organic phases were washed sequentially with saturated aqueous sodium bicarbonate and saturated aqueous sodium chloride, then dried over anhydrous magnesium sulfate. Concentration afforded 234.4 g of crude $CF_3(CF_2)_3CH_2CHI(CH_2)_8CH_2OH$ as a viscous, light amber liquid, which was used without further purification. To a slurry of 130.0 g of zinc powder in 500 mL of ethanol was added 5.0 g of acetic acid. A solution of 230.0 g of $CF_3(CF_2)_3CH_2CHI(CH_2)_8CH_2OH$ in 100 mL of ethanol was added dropwise with stirring over 1 hr, and the reaction mixture was heated at 50° C. for 4 hr. The mixture was filtered, the filtrate was concentrated to a viscous, light yellow liquid, and bulb-to-bulb distillation in several portions provided 97.3 g of $CF_3(CF_2)_3(CH_2)_{10}CH_2OH$ as a colorless solid, b.p. 160–200° C. at 0.05 torr (7 Pa).

$CF_3(CF_2)_7(CH_2)_{10}CH_2OH$ was prepared according to the following method: To a mixture of 41.10 g of perfluoro-n-octyl iodide and 11.92 g of 10-undecen-1-ol in a mixture of 100 mL of acetonitrile and 40 mL of water was added a mixture of 6.89 g of sodium bicarbonate and 13.58 g of sodium dithionite in small portions with stirring. The reaction mixture was stirred at room temperature overnight and acidified with 1 N hydrochloric acid. The mixture was extracted with diethyl ether, and the combined organic phases were washed sequentially with saturated aqueous sodium bicarbonate and saturated aqueous sodium chloride and dried over anhydrous magnesium sulfate. Concentration afforded 43.2 g of crude $CF_3(CF_2)_7CH_2CHI(CH_2)_8CH_2OH$ as a white solid, which was used without further purification. To a slurry of 19.6 g of Zn powder in 150 mL of ethanol was added 4.0 g of acetic acid. A solution of the crude $CF_3(CF_2)_7CH_2CHI(CH_2)_8CH_2OH$ prepared above in 50 mL of ethanol was added dropwise with stirring over 1 hr, and the reaction mixture was heated at 50° C. for 4 hr. The mixture was filtered, and the filtrate was concentrated to approximately 45 g of a soft, white solid. The crude $CF_3(CF_2)_7(CH_2)_{10}CH_2OH$ so obtained was used without further purification.

$C_4F_9SO_2NHCH_3$ was prepared according to the method described in Example 1 of PCT Publication No. WO 01/30873 (Savu et al.), the disclosure of which is incorporated herein by reference.

N-methylperfluorooctanesulfonamide ($C_8F_{17}SO_2NHCH_3$) and N-ethylperfluorooctanesulfonamide ($C_8F_{17}SO_2NHCH_3$) can be prepared generally according to the method described in Example 1 of U.S. Pat. No. 2,809,990 (Brown).

"SHFE" refers to a segregated hydrofluoroether available under the trade designation "3M NOVEC ENGINEERED FLUID HFE-7100", obtained from 3M Company.

"FSOLV" refers to perfluorinated solvent, obtained under the trade designation "3M FLUORINERT ELECTRONIC LIQUID FC-70", obtained from 3M Company.

Preparation of $C_7F_{15}CH_2OCH\ CH=CH_2$(E1):

To a stirred solution of 124 g of $C_7F_{15}CH_2OH$ and 62 g of allyl bromide in 1240 g of dimethyl sulfoxide was dropwise added a solution of 28.1 g of potassium hydroxide in 35 g of water. The mixture was allowed to stir for 4 hr, during which time it separated into two immiscible liquid phases. The reaction mixture was poured into a separatory funnel, and the lower layer was isolated and washed 3 times with water to remove any remaining solvent. The crude product was dried over anhydrous magnesium sulfate, filtered, and vacuum distilled to yield 103 g of $C_7F_{15}CH_2OCH_2CH=CH_2$ (E1), b.p. 88–89° C. at 30 torr (4 kilopascals (kPa)).

Preparation of $C_2F_5OC_2F_4CF_2CH_2OCH_2CH=CH_2$(E2):

A one-liter (L), three-neck round bottom flask was equipped with magnetic stirring, ice bath, and connection to a nitrogen bubbler. The flask was charged with a mixture of 100.4 g of $C_2F_5OC_2F_4OCF_2CH_2OH$ and 500 milliliters (mL) of dimethyl sulfoxide. While stirring this mixture, a solution of 29.1 g potassium hydroxide in 29.1 g of water was added, followed by 56.3 g of allyl bromide. After 10 min, the ice bath was removed, the mixture was allowed to warm to room temperature, and the mixture was stirred overnight. Stirring was stopped, and the reaction mixture separated into two liquid phases. Using a separatory funnel, the lower (product) layer was isolated. The upper phase was diluted to a volume of one liter with water, and the small amount of heavier liquid phase which separated was combined with the product layer. The product was washed four times with 200 mL portions of water, dried over anhydrous magnesium sulfate, filtered, and vacuum distilled to yield 83.3 g of $C_2F_5OC_2F_4OCF_2CH_2OCH_2CH=CH_2$ (E2), b.p. 93–97° C. at 140 torr (18 kPa)

Preparation of $CF_3(CF_2)_3OC_2F4OCF_2CH_2OC_2H_4OCH_2CH=CH$ (E3):

A one-liter, three-neck round bottom flask was equipped with magnetic stirring and connection to a nitrogen bubbler. The flask was charged with a mixture of 50.2 g of $CF_3(CF_2)_3OC_2F_4OCF_2CH_2OC_2H_4OH$ and 500 mL of dimethyl sulfoxide. The mixture was stirred rapidly while a solution of 7.8 g of potassium hydroxide in 7.4 g water was added, followed by 19.2 g of allyl bromide. The mixture was allowed to stir for 2.75 hr, at which time a solution of 0.91 g of potassium hydroxide in 0.97 g of water was added, and stirring continued overnight at room temperature. A solution of 1.1 g of potassium hydroxide in 1.1 g of water was then added, and stirring continued for another day at room temperature. At this point, the reaction mixture consisted of two liquid phases. The lower (product) layer was isolated using a separatory funnel, washed three times with 150 mL portions of water, dried over anhydrous magnesium sulfate, filtered (the filter cake was washed with a few mL of 1,1,2-trichlorotrifluoroethane, and the washings were combined with the product), then volatile components were removed using a rotary evaporator at water aspirator pressure. Analysis of the product by gas chromatography showed residual alcohol starting material to still be present, so the product was recombined with 100 mL of dimethyl sulfoxide, 0.87 g of allyl bromide, and a solution of 0.4 g of potassium hydroxide in 0.56 g of water, and the mixture was stirred overnight at room temperature (approximately 20° C.). The lower liquid layer was isolated, then washed with water, dried over anhydrous magnesium sulfate, and filtered. Vacuum distillation gave 44.3 g of $CF_3(CF_2)_3OC_2F_4OCF_2CH_2OC_2H_4OCH_2CH=CH_2$ (E3), b.p. 110–112° C. at 15 torr (2 kPa).

Preparation of $CH_2=CHCH_2OCH_2CF_2[(CF_2CF_2O)_q(CF_2O)_p]CF_2CH_2OCH_2CH=CH_2$ (E4)

To a stirred mixture of 100 g of glyme, 10.5 g of potassium hydroxide, 2 g of tetrabutylammonium bromide and 100 g of perfluoropolyetherdiol (FOMBLIN Z-DOL 2000) was added 22.5 g of allyl bromide over 1 hr at 45° C. The mixture was heated at reflux (85° C.) for 15 hr. Solvents and excess allyl bromide were removed by distillation, the mixture was filtered to remove solids, and then water washed to obtain a fluorochemical lower phase. The fluorochemical product was heated at 95° C. under reduced pressure (15 torr (2 kPa)) to remove all volatiles, yielding 96 g of $CH_2=CHCH_2OCH_2CF_2[(CF_2CF_2O)_q(CF2O)_p]CF_2CH_2OCH_2CH=CH_2$ (E4) having a number average molecular weight $M_n$ of 2,050 g/mole as determined by fluorine nuclear magnetic resonance spectroscopy ($^{19}F$ NMR).

Preparation of $CF_3(CF_2)_2[CF(CF_3)CF_2O]_xCF(CF_3)CH_2OCH_2CH=CH_2$(E5):

To a stirred solution containing 200 g of methanol and 200 g of $CF_3(CF_2)_2O[CF(CF_3)CF_2O]_xCF(CF_3)CO_2H$ (KRYTOX 157 FS(L)) was added 100 g of concentrated sulfuric acid. The mixture was heated at reflux (74° C.) for 4 hr. Water was added to obtain a lower fluorochemical phase, which was isolated. The isolated fluorochemical phase was heated to 95° C. under a reduced pressure of 15 torr (2 kPa) to remove volatiles, yielding 184 g of $CF_3(CF_2)_2O[CF(CF_3)CF_2O]_xCF(CF_3)CO_2CH_3$ with a number average molecular weight $M_n$ of 2,515 g/mole as determined by $^{19}F$ NMR.

$CF_3(CF_2)_2O[CF(CF_3)CF_2O]_xCF(CF_3)CO_2CH_3$ (166 g) was added over 1 hr to a stirred solution of 300 g of glyme and 28 g of sodium borohydride, and the mixture was heated at reflux (85° C.) for 15 hr. To this mixture was sequentially added 100 g of methanol, 200 g of water, and 67 g of concentrated sulfuric acid. Solvents were removed by distillation, and the mixture was filtered and washed with water to obtain a fluorochemical lower phase. The fluorochemical lower phase was heated at 95° C. and a reduced pressure of 15 torr (2 kPa) to remove volatiles, yielding 147 g of $CF_3(CF_2)_2O[CF(CF_3)CF_2O]_xCF(CF_3)CH_2OH$ with a number average molecular weight $M_n$ of 2,485 g/mole determined by $^{19}F$ NMR.

To a stirred solution of 100 g of glyme, 4.2 g of potassium hydroxide, 2 g of tetrabutylammonium bromide and 100 g of $CF_3(CF_2)_2O[CF(CF_3)CF_2O]_xCF(CF_3)CH_2OH$ (prepared above) was added 9 g of allyl bromide over 1 hr with heating at 45° C. The mixture was then heated at reflux (85° C.) for 15 hr. Solvents and excess allyl bromide were removed by distillation and the mixture was filtered and washed with water to obtain a fluorochemical lower phase. The fluorochemical product was heated at 95° C. and a reduced pressure of 15 torr (2 kPa) to remove volatiles yielding 96 g of $CF_3(CF_2)_2O[CF(CF_3)CF_2O]_xCF(CF_3)CH_2OCH_2CH=CH_2$ (E5) with a number average molecular weight $M_n$ of 2,350 g/mole as determined by $^{19}F$ NMR.

Preparation of $CF_3O(CF_2CF_2O)_wCF_2CH_2OCH_2CH=CH_2$ (E6)

One kilogram of poly(ethylene glycol) methyl ether $(CH_3O(CH_2CH_2O)_wCH_2CH_2OH$ with number average molecular weight $M_n$ of 550 g/mole, obtained from Aldrich Chemical Co., Milwaukee, Wis., product No. 20,248-7) was reacted with excess acetic anhydride at 125° C. for 1 hr. The mixture was then heated to 160° C. under vacuum to remove excess acetic anhydride and acetic acid, yielding 1032 g $CH_3O(CH_2CH_2O)_wCH_2CH_2OC(O)CH_3$ having a number average molecular weight $M_n$ of 590 g/mole as determined by proton nuclear magnetic resonance spectroscopy ($^1H$ NMR).

A solution was prepared by diluting 1032 g of $CH_3O(CH_2CH_2O)_wCH_2CH_2OC(O)CH_3$ with $CF_2ClCFCl_2$ to a volume of 1800 mL. This solution was fluorinated using 20 percent fluorine gas in nitrogen at 20° C., by feeding the solution over 23 hr into a 10-L reactor containing 6,000 mL of $CF_2ClCFCl_2$ and 4300 g of sodium fluoride and maintaining a 10 percent stoichiometric excess of fluorine gas throughout the reaction. After the reaction was completed, an excess of methanol was added. The solution was filtered to remove solids, washed with water to remove excess methanol, and $CF_2ClCFCl_2$ solvent was distilled off under reduced pressure. $CF_3O(CF_2CF_2O)_wCF_2CO_2CH_3$ (2382 g) was obtained having a number average molecular weight $M_n$ of 850 g/mole as determined by $^{19}F$ NMR. To a stirred solution of 1500 g of glyme and 43 g of sodium borohydride was added 800 g of $CF_3O(CF_2CF_2O)_wCF_2CO_2CH_3$ (0.94 mole, prepared above) over 1 hr and heated at reflux (85° C.) for 15 hr. To the reaction mixture was first added 400 g of methanol followed by 800 g of water and 280 g of concentrated sulfuric acid and heated to 95° C. to distill out solvents. The fluorochemical lower phase was heated to 95° C. at a pressure of 15 torr (2 kPa) to remove all volatiles, yielding 650 g of $CF_3O(CF_2CF_2O)_wCF_2CH_2OH$ with a number average molecular weight $M_n$ of 855 g/mole as determined by $^{19}F$ NMR.

To a stirred solution of 85 g of $CF_2ClCFCl_2$, 30 g of glyme, 2.5 g of potassium hydroxide, 1 g of tetrabutylammonium bromide, and 30 g of $CF_3O(CF_2CF_2O)_wCF_2CH_2OH$ (prepared above) was added 6.5 g of allyl bromide over 2 hr at 45° C. Solvents and excess allyl bromide were removed by distillation, and 170 g of $CF_2ClCFCl_2$ was added. The mixture was washed with 100 ML of 10 percent by weight hydrochloric acid, followed by washing with 2×100 g portions of water, then dried over anhydrous magnesium sulfate, and filtered. Volatiles were removed at 95° C. and a pressure of 15 torr (2 kPa), yielding 28 g of $CF_3O(CF_2CF_2O)_wCF_2CH_2OCH_2CH=CH_2$ (E6) with a number average molecular weight $M_n$ of 948 g/mole as determined by $^{19}F$ NMR.

Preparation of $CF_3(CF_2)_3(CH_2)_9CH=CH_2$ (E7):

To a mixture of 19.52 g of $CF_3(CF_2)_3(CH_2)_{10}CH_2OH$ and 200 mL of 48 weight percent aqueous hydrobromic acid was slowly added 20 mL of concentrated sulfuric acid. The reaction mixture was heated at 100° C. for 24 hr, and poured into 1 liter of water. The mixture was extracted with hexanes, and the combined organic phases were washed with saturated aqueous sodium bicarbonate and dried over anhydrous magnesium sulfate. The solution was concentrated to an amber liquid, which was eluted through 3 inches of silica with hexanes. Concentration of the eluent yielded a light amber liquid, and bulb-to-bulb distillation gave 19.82 g of $CF_3(CF_2)_3(CH_2)_{10}CH_2Br$ as a clear, colorless liquid, b.p. 120–170° C. at 0.06 torr (8 Pa).

To a solution of 10.00 g of $CF_3(CF_2)_3(CH_2)_{10}CH_2Br$ in a mixture of 8 mL of dimethyl sulfoxide and 35 mL of tetrahydrofuran at −20° C. was added 6.5 g of potassium tert-butoxide in several portions. The reaction mixture was allowed to warm to 0° C., and was poured into water. The mixture was extracted with diethyl ether, and the combined organic phases were washed with saturated aqueous sodium chloride, dried over anhydrous magnesium sulfate, and concentrated to a dark liquid. The crude product was eluted with hexanes through approximately 2.5 cm of silica, and the eluent was concentrated to a light amber liquid.

Distillation through a 6-inch (15 cm) Vigreux column yielded 4.97 g of $CF_3(CF_2)_3(CH_2)_9CH=CH_2$ (E7) as a clear, colorless liquid, b.p. 50–52° C. at 0.05 torr (7 Pa).

Preparation of $CF_3(CF_2)_7(CH_2)_9CH=CH_9$ (E8):

To a mixture of 29.0 g (0.049) of $CF_3(CF_2)_7(CH_2)_{10}CH_2OH$ and 250 mL of 48 percent by weight aqueous hydrobromic acid was slowly added 25 mL of concentrated sulfuric acid. The reaction mixture was heated at 100° C. for 18 hr and poured into 1 liter of water. The mixture was extracted with hexanes, and the combined organic phases were washed with saturated aqueous sodium bicarbonate and dried over anhydrous magnesium sulfate. The solution was concentrated to a dark liquid, which was eluted through 3 inches (8 cm) of silica with hexanes. Concentration of the eluent yielded 20.2 g of $CF_3(CF_2)_7(CH_2)_{10}CH_2Br$ as a nearly white solid, which was used without further purification.

To a solution of 9.80 g of $CF_3(CF_2)_7(CH_2)_{10}CH_2Br$ in a mixture of 8 mL of dimethyl sulfoxide and 40 mL of tetrahydrofuran at −10° C. was added 11.2 g of potassium tert-butoxide in several portions. The reaction mixture was allowed to warm to 0° C. and poured into cold water. The mixture was extracted with diethyl ether, and the combined organic phases were washed with saturated aqueous sodium chloride, dried over anhydrous magnesium sulfate, and concentrated to a dark semi-solid. The crude product was eluted through one inch (3 cm) of silica with hexanes, and the eluent was concentrated to a dark solid. Bulb-to-bulb distillation afforded 5.10 g of $CF_3(CF_2)_7(CH_2)_9CH=CH_2$ as a colorless solid, b.p. 110–120° C. at 0.10 torr (13 Pa).

Preparation of $C_4F_9SO_2N(CH_3)CH_2CH=CH_2$ (E9):

A 250 mL three-neck round-bottom flask equipped with thermometer, magnetic stirring, and addition funnel was charged with a solution of 75 g of $C_4F_9SO_2NHCH_3$ in 80 g of dimethyl sulfoxide. The solution was stirred while a solution of 17.1 g potassium hydroxide in 20 g of water was added in 2 mL aliquots via pipette. The solution turned cloudy during the addition, then cleared with additional stirring. Allyl bromide (31.9 g) was charged to the addition funnel, and added dropwise to the reaction mixture. A rise in temperature of the reaction mixture to 75° C. was noted during the addition. The reaction mixture turned cloudy shortly after the addition was begun, and stirring was continued overnight at room temperature. The reaction mixture was poured into a separatory funnel and allowed to stand until the liquid layers had separated. A few mL water were added to the mixture to facilitate phase separation. The lower layer was drawn off, washed with water and brine, and dried over anhydrous magnesium sulfate, leaving 76.0 g of a clear, colorless crude liquid product which was vacuum distilled to yield 68.7 g $C_4F_9SO_2N(CH_3)CH_2CH=CH_2$, b.p. 97–101° C. at 19 torr (2.5 kPa).

Preparation of $CF_3OC_2F_4OC_2F_4OCF_2C(O)NHCH_2CH=CH$) (E10):

To a 5-L flask containing 2068 g of triethylene glycol monomethyl ether (MTEG) in 500 mL dichloromethane was added 970 mL acetyl chloride over 4 hr. After addition was complete, infrared spectroscopy showed a slight excess of acetyl chloride. The resultant product (MTEG acetate) was stripped of volatiles. Direct fluorination was done in a tubular reactor as described in U.S. Pat. No. 5,578,278 (Fall et al.), the disclosure of which is incorporated herein by reference, using perfluoro-N-methylmorpholine (PNMM) (available under the trade designation "PF-5052" from 3M Company) as the liquid medium. MTEG acetate (2647 g) was pumped into the reaction zone at 44.6 g/hr while maintaining a gas flow of 2,500 ml/min $F_2$ in 10,000 mL/min $N_2$. At the end of the reaction (as judged by the presence of unreacted fluorine), addition of $F_2$ was stopped, then the reactor was flushed with $N_2$, and 1300 g methanol was added over approximately 2.5 hr. The mixture was stirred approximately 0.5 hr longer. The product mixture was drained to an approximately 60-L separatory funnel and washed twice with about 15–20L water introduced from a bottom valve. The fluorochemical layer was then isolated and dried over about 450 g anhydrous magnesium sulfate, filtered, and most of the PNMM was removed using a 5-plate distillation apparatus. The residue (5310 g) was distilled at about 740 torr (101 kPa) on a 30 cm Vigreux column to give 1256 g of $CF_3OC_2F_4OC_2F_4OCF_2CO_2CH_3$, b.p. 140–150° C. The above procedure was repeated yielding 2323 g of $CF_3OC_2F_4OC_2F_4OCF_2CO_2CH_3$, which was combined with the 1256 g previously obtained above to give 3579 g of $CF_3OC_2F_4OC_2F_4OCF_2CO_2CH_3$ in 84 percent purity by gas chromatography (remainder inert fluorochemical).

A 250 mL round-bottomed flask was charged with 46.2 g $CF_3OC_2F_4OC_2F_4OCF_2CO_2CH_3$ in 50 mL of methanol. Allylamine (7.8 g) was added in two approximately equal portions. After 15 min, gas chromatographic analysis showed complete conversion of the ester to the corresponding allyl amide. Solvent and excess allyl amine was removed by evaporation at reduced pressure. The remainder was distilled (b.p. 90–95° C. at 1 torr (133 Pa)) to obtain 41.3 g of cloudy product. This was filtered through a microfiber filter available under the trade designation "WHATMAN GRADE GF/B-BINDER-FREE GLASS FIBER" (1.0 micrometer pore size) from Whatman, PLC, 20/20 Maidstone, Kent, United Kingdom, and redistilled yielding 39 g of clear $CF_3OC_2F_4OC_2F_4OCF_2C(O)NHCH_2CH=CH_2$ in 96 percent purity.

$C_4F_9SO_2N(CH_3)(CH_2)_9CH=CH_2$ (E11):

A 500 mL three-necked round-bottom flask equipped with magnetic stirring, oil bath heat, and connection to a nitrogen bubbler was charged with 17.2 g of N-methylperfluorobutanesulfonamide ($C_4F_9SO_2NHCH_3$) and 250 mL dimethyl sulfoxide. Stirring was begun, and the solid dissolved within a few minutes. A solution of 4.0 g of potassium hydroxide in 5 mL of water was added via pipette, and stirring was continued for another 30 min while the oil bath was heated to 80° C. By the end of this period most of the potassium hydroxide had dissolved. 11-Bromo-1-undecene, obtained from Aldrich Chemical Co. (95 percent purity, 12.3 g) was then added to the flask via pipette, and the reaction mixture was left to stir for 19 hr at 80° C. The oil bath was then removed to allow the mixture to cool, and the flask contents were poured into a separatory funnel. The mixture separated into two liquid phases, and the lower layer was drawn off. The upper phase was diluted with an equal volume of water, causing separation of a small amount of lower phase. This was also drawn off and combined with the first batch. The combined crude product (18.0 g) was dissolved in 150 ml dichloromethane and washed successively with 100 ml portions of water, 10 weight percent aqueous potassium hydroxide solution, water, and brine. The dichloromethane solution was dried over anhydrous magnesium sulfate and filtered, then solvent was removed on a rotary evaporator at water aspirator pressure. This left 17.9 g light straw-colored liquid product. Bulb-to-bulb vacuum distillation of 17.3 g crude product at 160–180° C. and 0.3 torr (4 Pa) gave 16.2 g of N-(10-undecenyl)-N-methylperfluorobutanesulfonamide as a clear, colorless liquid distillate.

Preparation of $C_8F_{17}SO_2N(CH_3)CH_2CH=CH_2$ (E12)

A one-liter three-neck flask equipped with magnetic stirring and an addition funnel was charged with 150 g of N-methylperfluorooctanesulfonamide and 570 g of dimethyl sulfoxide, and the mixture was stirred for a few minutes until the solid dissolved. To this stirred solution was added a solution of 25 g of potassium hydroxide in 25 g of water. This mixture was allowed to stir for 30 min, then 46 g of allyl bromide was added dropwise via the addition funnel. An exotherm was noted after a few minutes. The reaction mixture was allowed to stir for 5.5 hr, during which time a white solid precipitated from solution. This solid was isolated by filtration, washed with 350 mL dimethyl sulfoxide, and dissolved in 450 g of 1,1,2-trichlorotrifluoroethane. This solution was transferred to a separatory funnel, washed with four 200 mL portions of water, and dried over anhydrous sodium sulfate. After removal of solvent by distillation at atmospheric pressure, the product was vacuum distilled to yield 138 g of $C_8F_{17}SO_2N(CH_3)CH_2CH=CH_2$, b.p. 98° C. at 0.4 torr (50 Pa) to 105° C. at 0.7 torr (90 Pa). The product was a clear, almost colorless liquid which solidified to a white, waxy solid upon standing at room temperature.

Preparation of $C_8F_{17}SON(CH_2CH_3)CH\ CH=CH_9$ (E13)

A two-liter three-neck flask equipped with magnetic stirring, addition funnel, and nitrogen blanket was charged with 250 g of N-ethylperfluorooctanesulfonamide and 960 g dimethyl sulfoxide. The mixture was stirred at room temperature until the solid had dissolved. Then, a solution of 35 g of potassium hydroxide in 38 g of water was added gradually over a period of about 1 min. The mixture was allowed to stir for several more minutes, then the addition funnel was charged with 71 g of allyl bromide. The allyl bromide was added dropwise over a period of about 30 min, then the mixture was allowed to stir at room temperature overnight. The reaction mixture, which now consisted of two liquid phases, was poured into a separatory funnel and the lower layer was drawn off, washed twice with dimethyl sulfoxide, twice with water, and twice with brine. Vacuum distillation yielded 216 g of $C_8F_{17}SO_2N(CH_2CH_3)CH_2CH=CH_2$ as a clear, almost colorless liquid, b.p. 80–85° C. at 0.1 torr (10 Pa).

General Procedure A: Preparation of a Silicon Substrate having Surface Si—H Bonds Silicon wafers (Si(111), 10 centimeter diameter disks of 1 millimeter thickness), obtained from WaferNet, Inc., San Jose, Calif., were cleaved into small pieces (approximately 1cm×3 cm). The pieces were cleaned by sequentially rinsing them in heptane, acetone, and isopropyl alcohol. The cleaned pieces were subjected for 10 min to ultraviolet light and ozone in an apparatus in which an ultraviolet lamp (5 inch by 5 inch square (12.5 cm by 12.5 cm) ultraviolet lamp, obtained from BHK, Inc. under the trade designation "UV GRID LAMP", Claremont, California, Model No. 88-9102-$O_2$) was encased in a small sheet metal box (13 cm wide×14 cm deep×15 cm high) such that the lamp was suspended 8 cm above the bottom of the box. A small lab jack was used to position silicon wafer pieces to be cleaned as close as possible to the ultraviolet lamp without physically contacting the lamp. The front of the box was a door, hinged at the top, which allowed samples to be inserted and removed. A small hole in one side of the box was attached to a source of oxygen that flowed into the box at a rate of approximately 1 to 5 standard liters per minute. Ozone was produced in situ by the action of ultraviolet light on molecular oxygen.

The wafer pieces were then individually immersed for 4 min in a 40 percent by weight solution of ammonium fluoride in water that had been sparged with nitrogen for at least 30 min to remove dissolved oxygen. This procedure etches away the native oxide ($SiO_2$) on the wafer resulting in a hydride-terminated, nearly atomically flat Si(111) surface.

Finally, the silicon wafer pieces were washed with water and isopropyl alcohol and blown dry with nitrogen.

General Procedure B: Grafting an Olefin to a Silicon Substrate having Surface Si—H Bonds A silicon wafer piece having surface Si—H bonds, prepared according to the General Procedure A (above), was placed in a test tube containing a 5 percent by volume solution of the desired olefin in either hexadecane or FSOLV, which had previously been sparged with nitrogen for 30 min to remove residual oxygen.

After introduction of the olefin, the test tube was sealed with a silicone rubber septum and the solution was sparged with nitrogen for an additional 15 min. The test tube was placed in a heat bath set so that the internal test tube temperature reached 200° C. The heat bath consisted of a 1200 mL stainless steel beaker, obtained from Polar Ware, Sheboygan, Wis., in a heating mantle specifically for metal beakers, obtained from Glas-Col, Catalog No. TM630, Terre Haute, Ind. The stainless steel beaker was filled to within 3 cm of the top with chrome steel balls, approximately 3.2 mm in diameter (obtained from Hartford Ball Co., Hartford, Conn.). The heat bath temperature was controlled using a digital temperature controller (Catalog No. 12113-50), obtained from Ace Glass, Vineland, N.J., and equipped with a stainless steel sheathed type K thermocouple (4.8 mm diameter, 10 cm length), which was placed in the heat bath. After 3 hr, the test tube was removed from the heat bath, and cooled to room temperature. The silicon wafer piece was removed from the test tube. If hexadecane was used as solvent, the silicon wafer piece was then washed sequentially with heptane, acetone, and isopropyl alcohol. If FSOLV was used as solvent, the silicon wafer piece was then rinsed with SHFE. The silicon wafer piece was further rinsed sequentially with heptane, acetone, and isopropyl alcohol. The rinsed silicon wafer piece was then dried using a stream of dry nitrogen.

General Procedure C: Grafting an Olefin to a Silicon Substrate having Surface Si—H Bonds A solution of 5 percent by weight of olefin, 5 percent by weight of 2-hydroxy-2-methyl-1-phenyl-1-propanone (obtained under the trade designation "DAROCUR 1173" from Ciba Specialty Chemicals) free-radical photoinitiator, and 90 percent by weight solvent was placed in a quartz tube and sparged with nitrogen for 15 min. A silicon wafer piece having surface Si—H bonds, prepared according to the General Procedure A (above), was then added and the tube was sealed under dry nitrogen. The solution, under dry nitrogen, was irradiated for 30 min using an ultraviolet fluorescent light (obtained from Osram Sylvania, Danvers, Mass., under the trade designation "BLACKLIGHT BLUE BLB 15W"). The solution was positioned at a distance of about 2 cm from the light source. Wafers functionalized with non-fluorinated olefins were then sequentially washed in heptane, acetone, and isopropyl alcohol, then blown dry with dry nitrogen. Silicon wafers functionalized with fluorinated olefins were sequentially washed with SHFE, heptane, acetone, and isopropyl alcohol, then blown dry with dry nitrogen.

General Procedure D: Grafting an Olefin to a Silicon Substrate having Surface Si—H Bonds A silicon wafer piece having surface Si—H bonds, prepared according to General Procedure A (above), was placed in a test tube containing a 5 percent by volume solution of the olefin indicated in Table 3 (below) in FSOLV, which had previously been sparged with nitrogen for 30 min to remove residual oxygen.

After introduction of the silicon wafer piece, the test tube was sealed with a silicone rubber septum and the solution was sparged with nitrogen for 15 more min. The test tube, still under nitrogen, was placed in a silicone oil heat bath set at 180° C. The heat bath was obtained under the trade designation "INSTATHERM OIL BATH, HIGH FORM" from Ace Glass (Part No. 9603-$O_2$) filled with high temperature silicone oil (Ace Glass, Part No. 14115-12). Temperature was controlled using a temperature controller, obtained under the trade designation "THERM-O-WATCH L7-1100SA/28T", from Instruments for Research and Industry, Inc., Cheltenham, Pa. After 15 min in the oil bath, the test tube was removed, and cooled to room temperature by placing the test tube in room temperature water. The wafer piece was removed from the test tube. The wafer piece was rinsed with SHFE. The wafer piece was further rinsed sequentially with heptane, acetone, and isopropyl alcohol. The wafer piece was then blown dry with dry nitrogen.

Examples 1–11 and Comparative Examples 1–3

A series of olefins corresponding to Examples 1–11 and Comparative Examples 2–3, as indicated in Table 1 (below), were grafted to silicon (111) wafer pieces having Si-H bonds according to General Procedure B (above). For Examples 1–10 and Comparative Examples 2–3, Table 1 reports advancing and receding contact angles of water and hexadecane with an olefin treated surface of the silicon wafer piece. Comparative Example 1 was a silicon chip, prepared according to the General Procedure A (above), but not treated with any olefin. The contact angles for water and hexadecane reported in Table 1 were measured using an etched silicon wafer piece surface having no subsequent olefin treatment.

TABLE 1

| | | | Contact Angle advancing/ receding, (degrees) | |
|---|---|---|---|---|
| Example | Olefin | Solvent | Water | Hexadecane |
| Comparative Example 1 | none | none | 89/69 | <10/<10 |
| Comparative Example 2 | $CF_3(CF_2)_7CH=CH_2$ | FSOLV | 115/107 | 65/56 |

TABLE 1-continued

| Example | Olefin | Solvent | Contact Angle advancing/ receding, (degrees) | |
|---|---|---|---|---|
| | | | Water | Hexadecane |
| Comparative Example 3 | CH$_3$(CH$_2$)$_{13}$CH═CH$_2$ | hexadecane | 110/103 | 27/26 |
| 1 | E1 | FSOLV | 117/103 | 69/62 |
| 2 | E2 | FSOLV | 118/111 | 71/63 |
| 3 | E3 | FSOLV | 113/97 | 63/56 |
| 4 | E4 | FSOLV | 123/92 | 69/49 |
| 5 | E5 | FSOLV | 121/109 | 71/66 |
| 6 | E6 | FSOLV | 125/97 | 72/52 |
| 7 | E7 | hexadecane | 113/104 | 53/49 |
| 8 | E8 | FSOLV | 121/107 | 67/61 |
| 9 | E9 | FSOLV | 85/47 | 34/26 |
| 10 | E10 | FSOLV | 113/59 | 61/44 |
| 11 | E11 | hexadecane | 106/86 | 47/38 |

Example 12

A 0.5 cm×0.5 cm square silicon chip having a series of unreleased (i.e., still having a protective photoresist) MEMS cantilever beams (similar to that described in R. Maboudian et al., Tribology Letters, vol. 3, pp. 215–221 (1997), the disclosure of which is incorporated herein by reference) was made utilizing the Cronos MUMPS process with the following noted changes. The unreleased beams were made of polycrystalline silicon and positioned parallel to the polycrystalline silicon surface at a distance of 2 micrometers. The beams were regularly spaced to form an array (20 micrometers pitch), 3.5 micrometers thick, 10 micrometers wide, and had lengths varying in intervals of 50 micrometers from 200 to 1500 micrometers. The chip also had reference posts having a height of 5.5 micrometers thickness.

To remove protective photoresist resulting from the MUMPS process, the chip was sonicated in acetone for 20 min using an ultrasonic bath, obtained under the trade designation "FISHER SCIENTIFIC FS3 ULTRASONIC CLEANER" (Fisher Scientific, Pittsburgh, Pa.), then sonicated in isopropyl alcohol (as before) for 5 min.

Release of the MEMS cantilever beams and rinsing of the MEMS chips was performed in a "fill/drain" apparatus similar to that described in R. Maboudian et al., Sensors and Actuators A (2000), vol. 82, pages 219–223. The "fill/drain" apparatus consisted of a block of polytetrafluoroethylene into which had been drilled a large hole (3.8 cm deep and 3.8 cm diameter), forming a reservoir. A drain hole, drilled in the center of the bottom of the reservoir, was fitted with a polytetrafluoroethylene stopcock assembly, allowing the reservoir to be filled when the stopcock was closed and drained when it was opened. Six small slots (9.5 mm diameter, 1.6 mm deep) were machined into the bottom of the reservoir in a circle around the drain (the drain hole was at the same level as the tops of the slots) to allow MEMS chips to be positioned under the surface of the liquid in the reservoir even after it had been drained.

The chip was placed in a slot of the "fill/drain" apparatus. CMOS grade 49 percent by weight aqueous HF (J. T. Baker, Phillipsburg, N.J.) was added and allowed to sit for 3 min to release the cantilever beam MEMS devices. The apparatus was then drained. A volume of 25 mL deionized water (>18 megohms) from a purification system, obtained under the trade designation "MILLI-Q" was then added to the apparatus to displace the aqueous HF. The water was then drained, and the process was repeated nine additional times, such that total water washing lasted for 10 min, and a total of 250 mL water was used. After the last of the water was drained, 5 mL of CMOS grade 49 percent by weight aqueous HF was added and allowed to etch the MEMS chip again for 3 min. The aqueous HF was again drained. The etched chip was then sequentially washed in isopropyl alcohol for 10 min, and SHFE for 10 min, each wash being performed in the same manner as the water wash above, with 10 fill and drain cycles over 10 min. Washing with FSOLV was accomplished by adding 5 mL of FSOLV and draining, repeating this two times for a total of three fill and drain cycles.

The chip was removed from the "fill/drain" apparatus and placed in a test tube containing a 5 percent by weight solution of E1 in FSOLV. This solution had been sparged 15 min with nitrogen before use. The solution was heated at 200° C. for 1 hr, and allowed to cool. After cooling, the MEMS chip was removed from the E1 and FSOLV solution, placed in a small glass cup (approximately 2 ml) containing SHFE and washed by adding 30 mL additional SHFE to the small cup over 10 min time. Drying the MEMS chip was accomplished by placing the small glass cup containing SHFE and the MEMS chip in an oven at 140° C. for 10 min.

To determine whether the MEMS cantilever beams were adhered to the silicon chip surface or not, the MEMS chip was examined using an optical microscope (obtained under the trade designation "OPTIPHOT 150" from Nikon, Nelville, N.Y.). The MEMS cantilever beams were examined under high magnification (1000×) and the reference posts were brought into focus. Beams having a free tip that was in the same focal plane as the reference posts were judged to be released and free of stiction. Beams that were not simultaneously in focus (with the reference posts) at their free tip, and had a focal plane closer to the silicon chip surface than the top surface of the reference post were judged to be stuck to the silicon chip surface (i.e., exhibited stiction).

Treated MEMS cantilever beams prepared above, up to at least 1500 micrometers in length, were observed to be free from stiction to the silicon chip surface by this technique.

Comparative Example 4

A MEMS chip containing cantilever beams as in Example 12 was sonicated in acetone for 20 min, then isopropyl alcohol for 5 min to remove photoresist. The chip was then placed in a slot of the "fill/drain" apparatus of Example 11 and etched with 5 mL 49 percent by weight aqueous HF for 3 min, then washed with 10×25 mL portions of deionized (>18 megohms) water, and then further washed with 10×25 mL portions of isopropyl alcohol. The etched chip was removed, placed in a small glass cup containing isopropyl alcohol, and the cup, MEMS chip and isopropyl alcohol were then dried in an oven at 140° C. for 10 min. By this method, using the analysis method of Example 12, cantilever beams of less than or equal to 400 micrometers in length released properly and did not show evidence of stiction. However, beams longer than 400 micrometers did not release properly from the silicon chip surface (i.e., they were stuck to the chip surface).

Examples 13–21 and Comparative Examples 5–13

Examples 13–16, and Comparative Examples 5, 6, and 8, were prepared by General Method C.

Example 17, was carried out by General Method C with the following changes: The solution consisted of 10 parts by weight of 50 percent by weight tert-butyl peroxy-2-ethylhexanoate in odorless mineral spirits (obtained under the trade designation "TRIGONOX 21-C50" from Akzo Nobel, Chicago, Ill.) as initiator, 10 parts by weight of E1, and 80 parts by weight SHFE solvent. A germicidal light emitting primarily 254 nm electromagnetic radiation (obtained under the trade designation "15 W G 15T8" from Osram Sylvania) was used in place of the BLACKLIGHT BLUE BLB 15W bulb.

Example 18 was carried out as in Example 17 except that no exposure to light was used. Instead, the sample was warmed in an oil bath at 50° C. for 30 min.

Example 19 was carried out according to General Method C, except that a polycrystalline silicon wafer (10,000 Å undoped polysilicon on a 100 mm diameter Si(100) wafer obtained from WaferNet; prepared according to General Procedure A with the exception that the wafer piece was etched in CMOS grade 49 percent by weight aqueous HF for 3 min instead of etching in the ammonium fluoride solution) was used as the substrate, and E1 was used at 45 weight percent in a mixture of 5 weight percent 2-hydroxy-2-methyl-1-phenyl-1-propanone and 50 weight percent heptane.

Example 20 was carried out as in Example 19 except that E1 was used at 5 weight percent in a mixture of 5 weight percent 2-hydroxy-2-methyl-1-phenyl-1-propanone and 90 weight percent heptane.

Example 21 was carried out using a 1×1 cm piece of silicon (100) (obtained from WaferNet). The piece was cleaned by sequentially rinsing it in heptane, acetone, and isopropyl alcohol. The cleaned piece was subjected for 10 min to ultraviolet light and ozone using the ozone apparatus described in General Procedure A. The silicon piece was placed in a test tube. Acetone was added and the mixture was sonicated for 20 min. The acetone was decanted. Isopropyl alcohol was added and the mixture was sonicated for 20 min. The isopropyl alcohol was decanted and the silicon piece was allowed to dry in air. The silicon piece was placed into CMOS-grade 49 weight percent aqueous HF and allowed to stand for 3 min. The silicon piece was removed from the HF and placed in approximately 100 mL of water ($\geq$18 megohm resistivity) in a plastic container. The silicon piece was again placed into CMOS-grade 49 weight percent aqueous HF and allowed to stand for 3 min. The silicon piece was removed from the HF, and then placed in approximately 100 mL isopropyl alcohol in a plastic container. It was then removed from the isopropyl alcohol and placed in small glass cup (approximately 2 mL volume) filled with isopropyl alcohol. The isopropyl alcohol was displaced with 30 mL of heptane over 10 min. The silicon piece was placed into a quartz tube containing a solution of 45 weight percent E1 and 5 weight percent 2-hydroxy-2-methyl-1-phenyl-1-propanone in heptane that had been sparged with nitrogen for 15 min. The silicon piece was irradiated for 30 min as in General Procedure B. The silicon piece was removed from the tube and placed into a small glass cup (approximately 2 mL volume) filled with heptane. The silicon piece was rinsed by adding heptane (30 mL) to the cup over 10 min, followed by 30 ml isopropyl alcohol added over 10 min, and 30 ml of SHFE over 10 min. The wafer was removed from the cup and blown dry with nitrogen.

Comparative Examples 7 and 9 were carried out according to General Method C except that no solvent was used. The solution consisted of 5 percent by weight of 2-hydroxy-2-methyl-1-phenyl-1-propanone in the indicated olefin.

Comparative Examples 10 and 11 were carried out as in Comparative Examples 7 and 6, respectively, except that 2,2-dimethoxy-2-phenylacetophenone was used in place of 2-hydroxy-2-methyl-1-phenyl-1-propanone.

Comparative Examples 12 and 13 were carried out as in Comparative Examples 10 and 11, respectively, except that five freeze-thaw cycles were used to deoxygenate the tube contents.

For Examples 13–21 and Comparative Examples 5–13, the olefin and solvent utilized and resulting contact angle measurements are reported in Table 2 (below).

TABLE 2

| Example | Olefin | Solvent | Contact Angle advancing/receding, (degrees) | |
|---|---|---|---|---|
| | | | Water | Hexadecane |
| Comparative Example 5 | $CF_3(CF_2)_3CH=CH_2$ | heptane | 85/71 | <10/<10 |
| Comparative Example 6 | $CH_3(CH_2)_{13}CH=CH_2$ | heptane | 103/88 | <10/<10 |
| Comparative Example 7 | $CH_3(CH_2)_{13}CH=CH_2$ | none | 110/101 | 25/24 |
| Comparative Example 8 | $CH_3(CH_2)_{17}CH=CH_2$ | heptane | 106/96 | <20/<20 |
| Comparative Example 9 | $CH_3(CH_2)_{17}CH=CH_2$ | none | 111/92 | 41/38 |
| Comparative Example 10 | $CH_3(CH_2)_{13}CH=CH_2$ | none | 112/99 | 35/30 |
| Comparative Example 11 | $CH_3(CH_2)_{13}CH=CH_2$ | heptane | 105/91 | <10/<10 |
| Comparative Example 12 | $CH_3(CH_2)_{13}CH=CH_2$ | none | 109/98 | <20/<20 |
| Comparative Example 13 | $CH_3(CH_2)_{13}CH=CH_2$ | heptane | 105/91 | <10/<10 |
| 13 | E7 | heptane | 96/81 | 31/24 |
| 14 | E9 | heptane | 87/69 | 30/20 |
| 15 | E10 | heptane | 101/82 | 48/40 |
| 16 | E1 | heptane | 112/107 | 57/52 |
| 17 | E1 | SHFE | 105/92 | 57/51 |
| 18 | E1 | SHFE | 97/78 | 47/39 |
| 19 | E1 | heptane | 126/93 | 66/34 |
| 20 | E1 | heptane | 100/66 | <20/<20 |
| 21 | E1 | heptane | 100/79 | 38/30 |

Example 22

A silicon chip, prepared as in Example 12, containing MEMS cantilever beams and having the photoresist removed, was placed in the "fill/drain" apparatus. A volume of 5 mL CMOS grade 49 percent by weight aqueous HF was added to the apparatus and allowed to etch the chip for 3 min to release the cantilever beam MEMS devices. The chip was then washed with 10×25 mL portions of deionized water ($\geq$18 megohms resistance) over a total period of 10 min. After the last of the water was drained, 5 mL of CMOS grade 49 percent by weight aqueous HF was added and allowed to etch the MEMS chip again for 3 min. The aqueous HF was again drained. The etched chip was then sequentially washed in isopropyl alcohol for 10 min, and heptane for 10 min, each wash being performed in the same manner as the water wash, with 10 fill and drain cycles over 10 min.

The chip was removed from the heptane, and placed in a quartz tube in a solution (sparged with dry nitrogen for 15 min) containing 5 parts by weight of E1, 5 parts by weight 2-hydroxy-2-methyl-1-phenyl-1-propanone (having the trade designation "DAROCUR 1173") free-radical photoinitiator, and 90 parts by weight heptane. The tube was fitted with a rubber septum and irradiated for 30 min under the conditions of Example 11. After irradiation, the MEMS chip was removed from the quartz tube and placed in a small glass cup (approximately 2 mL volume) containing heptane.

The MEMS chip was washed by adding 30 mL of heptane over a period of 10 min to the cup (excess overflowed). This was followed by addition of 30 mL isopropyl alcohol to the cup over 10 min time, followed by addition of 30 mL SHFE to the cup over 10 min time. The cup containing the MEMS chip (under SHFE) was placed in an oven at 140° C. for 10 min, thereby drying the MEMS chip. According to this procedure, cantilever beams having a length of 1150 micrometers long were observed (according to the method of Example 12) to be free from the surface, with longer beams showing evidence of stiction.

Example 23

A chip as in Example 12, containing MEMS cantilever beams and having the photoresist removed, was immersed in CMOS grade 49 percent by weight aqueous HF for 3 min to release the cantilever beam MEMS devices. The chip was then washed with deionized water ($\geq 18$ megohms resistance) for 10 min. The etched chip was then washed in isopropyl alcohol for 2 min, followed by another isopropyl alcohol rinse for 3 min. The chip was transferred to a third isopropyl alcohol bath in a small dish (~2 mL volume) used for coating the sample. The isopropyl alcohol was displaced from the dish containing the chip with 10×2 mL portions SHFE. The SHFE was then displaced with 6×2 mL portions of a 1.0 millimolar solution of E10 in SHFE (approx. 90 g) containing two drops of a solution of 1 g of chloroplatinic acid in 10 mL of isopropyl alcohol and held for 1 min. The coating solution was then displaced with 10×2 mL portions of SHFE. The MEMS chip was dried by placing the sample dish containing the chip under SHFE into a heated 10 mL high-pressure stainless steel vessel equipped with a high-pressure pump at the inlet and a vent line at the outlet. The vessel was filled with $CO_2$ at 60° C. and 200 atmospheres pressure (20 megaPascals)). The contents of the vessel were displaced with 5×10 mL portions of $CO_2$, effectively removing the SHFE. The $CO_2$ remaining in the vessel was vented to atmospheric pressure and the dry chip was removed for evaluation according to the method of Example 12. Cantilever beams having a length of 1450 micrometers were observed to be free from the surface, with longer beams showing evidence of stiction.

Examples 24–25 and Comparative Example 14

Examples 24–25 and Comparative Example 14 were carried out according to 10 General Procedure D. The specific fluorinated olefin used, solvent, and results of contact angle measurements are reported in Table 3 (below)

TABLE 3

| | | | Contact Angle advancing/receding, (degrees) | |
|---|---|---|---|---|
| Example | Olefin | Solvent | Water | Hexadecane |
| Comparative Example 14 | $CF_3(CF_2)_7CH=CH_2$ | FSOLV | 109/98 | 58/50 |
| 24 | E1 | FSOLV | 111/84 | 59/52 |
| 25 | E8 | FSOLV | 119/106 | 63/58 |

Examples 26–30

Effects of hydrosilylation process conditions for fluorinated olefin E9 are reported in Examples 26–30. General Procedure A was used to prepare the silicon substrate used in Examples 26–30.

Example 26 was carried out according to General Procedure B, except that neat E9 was placed in a test tube having a ground glass joint and fitted with a condenser. Prior to introduction of the silicon wafer piece, the E9 in the test tube was sparged for 30 min with nitrogen. After the sample was introduced, nitrogen sparging was continued for 15 min.

Example 27 was carried out according to General Procedure D with the following changes: neat E9 was used (i.e., no solvent); prior to introduction of the silicon wafer piece, the E9 in the test tube was sparged for 1 hr with nitrogen; after the silicon wafer piece was introduced to the tube, nitrogen sparging was continued for 2.5 hr, then the sample was heated in an oil bath at 180° C. for 30 min.

Example 28 was carried as in Example 27 except that a 5 percent by volume solution of E9 in FSOLV was used in place of neat E9.

Example 29 was carried out as in Example 26, except that no condenser was utilized.

Example 30 was carried out using a glass apparatus consisting of three pieces of tubing joined in the shape of an "H". The top of each part of the "H" was open for sample and reagent introduction. The "crossbar" of the "H" was 2 cm above the bottoms of the "H". Into one leg of the "H" was placed the Si wafer piece, and into the other was placed 1 mL of E9. The etched silicon wafer piece having Si—H bonds was placed in the dry side of the "H" after the neat compound in the wet side had been sparged for 30 min with nitrogen. The tops of the "H" were sealed with rubber septa, and the apparatus was purged for an additional hour with nitrogen. The outlet tube for the nitrogen purge was removed, but the inlet tube was left on so the apparatus remained under a positive pressure of nitrogen. The apparatus was then placed in the heat bath according to General Procedure B for 4.5 hr, removed and cooled for 5 min using room temperature water. The wafer piece was removed and sequentially washed with SHFE, heptane, acetone, isopropyl alcohol, and blown dry.

Results of contact angle measurements, reported in Table 4 (below), can be compared to results reported, for example, in Comparative Example 1 and Example 9.

TABLE 4

| | | | Contact Angle advancing/receding, (degrees) | |
|---|---|---|---|---|
| Example | Process Conditions | Solvent | Water | Hexadecane |
| 26 | 200° C., 3 hr | neat | 59/<10 | <10/<10 |
| 27 | 180° C. oil bath, 30 min | neat | 91/72 | 39/29 |
| 28 | 180° C. oil bath, 30 min | FSOLV | 80/61 | 33/23 |
| 29 | 200° C., 3 hr | neat | 68/29 | <10/<10 |
| 30 | 200° C., 4.5 hr | none, vapor phase | 93/64 | 46/37 |

Examples 31–34

Examples 31–34 illustrate the effect of hydrosilylation process conditions for fluorinated olefins E12 and E13.

Example 31 was carried according to General Procedure D, except that neat E12 was used (no solvent), and the tube was heated at 180° C. for 30 min.

Example 32 was carried out as in Example 30, except that 100 milligrams of E12 was used as the olefin instead of E9.

Example 33 was carried out as in Example 31, excepting that E13 was used instead of E12.

Example 34 was carried out as in Example 30, except that E13 was used instead of E9.

Results of contact angle measurements are reported in Table 5 (below).

TABLE 5

| Example | Olefin | Process Conditions | Phase | Contact Angle advancing/receding (degrees) | |
|---|---|---|---|---|---|
| | | | | Water | Hexadecane |
| 31 | E12 | 180° C., 30 min | liquid | 84/39 | 43/31 |
| 32 | E12 | 200° C., 4.5 hr | vapor | 106/76 | 54/47 |
| 33 | E13 | 180° C., 30 min | liquid | 83/43 | 41/28 |
| 34 | E13 | 200° C., 4.5 hr | vapor | 100/64 | 51/45 |

Various modifications and alterations of this invention will become apparent to those skilled in the art without departing from the scope and spirit of this invention, and it should be understood that this invention is not to be unduly limited to the illustrated embodiments set forth herein.

What is claimed is:

1. A method for modifying a silicon substrate comprising:

providing a silicon substrate having a plurality of Si—H bonds;

providing a composition comprising:

a fluorinated olefin having the formula:

$$\begin{array}{c} H \\ \diagdown \\ C \\ \| \\ C \\ \diagup \diagdown \\ H \quad H \end{array} C_mH_{2m}-Z-C_nH_{2n}-R_f$$

wherein m is an integer greater than or equal to 1,
   n is an integer greater than or equal to 0,
   Z is a divalent linking group,
   $R_f$ is a highly fluorinated organic group, and optional solvent; and contacting the composition with the silicon substrate under conditions such that the fluorinated olefin becomes covalently attached to the surface of the silicon substrate.

2. The method of claim 1, wherein m is in the range of from about 1 to about 20.

3. The method of claim 1, wherein m is about 1.

4. The method of claim 1, wherein n is in the range of from about 0 to about 20.

5. The method of claim 1, wherein n is in the range of from about 0 to about 3.

6. The method of claim 1, wherein Z is a covalent bond, —O—, or $$-\underset{\underset{R^1}{|}}{\overset{\overset{O}{\|}}{N-C}}-,$$

wherein $R^1$ is alkyl or H.

7. The method of claim 1, wherein Z is —O— or $$-\underset{\underset{H}{|}}{\overset{\overset{O}{\|}}{N-C}}-.$$

8. The method of claim 1, wherein $R_f$ contains fluorine in an amount of greater than or equal to at least 50 percent by weight.

9. The method of claim 1, wherein $R_f$ contains fluorine in an amount of greater than or equal to at least 60 percent by weight.

10. The method of claim 1, wherein $R_f$ comprises a perfluoroalkyl group having from about 4 to about 12 carbon atoms.

11. The method of claim 1, wherein the fluorinated olefin comprises a poly(perfluoroalkyleneoxy) group.

12. The method of claim 1, wherein the fluorinated olefin has the formula:

$$R_f-\underset{\underset{R^1}{|}}{\overset{\overset{O}{\|}}{C-N}}CH_2CH=CH_2.$$

13. The method of claim 12, wherein the fluorinated olefin comprises a poly(perfluoroalkylenoxy) group.

14. The method of claim 1, wherein the fluorinated olefin comprises a plurality of allyloxy groups.

15. The method of claim 1, wherein the fluorinated olefin has the formula:

$$R_f-CH_2OCH_2CH=CH_2.$$

16. The method of claim 15, wherein $R_f$ contains fluorine in an amount of greater than or equal to at least 50 percent by weight.

17. The method of claim 15, wherein $R_f$ contains fluorine in an amount of greater than or equal to at least 60 percent by weight.

18. The method of claim 15, wherein $R_f$ comprises a perfluoroalkyl group having from about 4 to about 12 carbon atoms.

19. The method of claim 15, wherein the fluorinated olefin comprises a poly(perfluoroalkylenoxy) group.

20. The method of claim 15, wherein the fluorinated olefin comprises a plurality of allyloxy groups.

21. The method of claim 1, wherein the silicon substrate comprises a microelectromechanical systems device.

22. The method of claim 1, wherein the silicon substrate comprises a microfluidic device.

23. The method of claim 1, wherein the composition further comprises solvent having a boiling point of greater than or equal to about 180° C.

24. The method of claim 1, wherein said conditions comprise a temperature in excess of about 180° C.

25. The method of claim 1, wherein contacting the composition with the silicon substrate comprises contacting a fluorinated olefin vapor with the silicon substrate.

26. The method of claim 1, wherein the composition further comprises at least one of a free-radical photoinitiator or a photocatalyst; and wherein said conditions comprise electromagnetic radiation.

27. The method of claim 26, wherein the free-radical photoinitiator comprises 2-hydroxy-2-methyl-1-phenyl-1-propanone.

28. An article comprising a chemically modified silicon substrate prepared according to a method comprising:
   providing a silicon substrate;
   etching the silicon substrate to form a plurality of Si—H bonds;
   providing a composition comprising:
      a fluorinated olefin having the formula:

$$\begin{array}{c} H \\ \phantom{H}\diagdown \\ \phantom{HH}C - C_mH_{2m} - Z - C_nH_{2n} - R_f \\ \phantom{HH}\| \\ \phantom{HH}C \\ \phantom{H}\diagup\phantom{H}\diagdown \\ H \phantom{HHHH} H \end{array}$$

wherein
      m is an integer greater than or equal to 1,
      n is an integer greater than or equal to 0,
      Z is a divalent linking group,
      $R_f$ is a highly fluorinated organic group, and optional solvent; and
   contacting the composition with the silicon substrate under conditions such that the fluorinated olefin becomes covalently attached to the silicon substrate.

29. The article of claim 28, wherein m is in the range of from about 1 to about 20.

30. The article of claim 28, wherein m is about 1.

31. The article of claim 28, wherein n is in the range of from about 0 to about 20.

32. The article of claim 28, wherein n is in the range of from about 0 to about 3.

33. The article of claim 28, wherein Z is a covalent bond, —O—, or $$-\underset{\underset{R^1}{|}}{\underset{\|}{N-C}}-,$$

$$\text{where the C has a double-bonded O}$$

wherein $R^1$ is alkyl or H.

34. The article of claim 28, wherein Z is —O— or $$-\underset{\underset{H}{|}}{\underset{\|}{N-C}}-.$$

35. The article of claim 28, wherein $R_f$ contains fluorine in an amount of greater than or equal to at least 50 percent by weight.

36. The article of claim 28, wherein $R_f$ contains fluorine in an amount of greater than or equal to at least 60 percent by weight.

37. The article of claim 28, wherein $R_f$ comprises a perfluoroalkyl group having from about 4 to about 12 carbon atoms.

38. The article of claim 28, wherein the fluorinated olefin comprises a poly(perfluoroalkylenoxy) group.

39. The article of claim 28, wherein the fluorinated olefin has the formula:

$$R_f - \underset{\underset{R^1}{|}}{\overset{\overset{O}{\|}}{C}}NCH_2CH = CH_2.$$

40. The article of claim 28, wherein the fluorinated olefin comprises a plurality of allyloxy groups.

41. The article of claim 28, wherein the fluorinated olefin has the formula:

$$R_f - CH_2OCH_2CH = CH_2.$$

42. The article of claim 41, wherein $R_f$ contains fluorine in an amount of greater than or equal to at least 50 percent by weight.

43. The article of claim 41, wherein $R_f$ contains fluorine in an amount of greater than or equal to at least 60 percent by weight.

44. The article of claim 41, wherein $R_f$ comprises a perfluoroalkyl group having from about 4 to about 12 carbon atoms.

45. The article of claim 41, wherein the fluorinated olefin comprises a poly(perfluoroalkylenoxy) group.

46. The article of claim 41, wherein the fluorinated olefin comprises a plurality of allyloxy groups.

47. The article of claim 28, wherein the silicon substrate comprises a microelectromechanical systems device.

48. The article of claim 28, wherein the silicon substrate comprises a microfluidic device.

49. The article of claim 28, wherein the composition further comprises solvent having a boiling point of greater than or equal to about 180° C.

50. The article of claim 28, wherein said conditions comprise a temperature in excess of about 180° C.

51. The article of claim 28, wherein contacting the composition with the silicon substrate comprises contacting a fluorinated olefin vapor with the silicon substrate.

52. The article of claim 28, wherein the composition further comprises at least one of a free-radical photoinitiator or a photocatalyst; and wherein said conditions comprise electromagnetic radiation.

53. The article of claim 28, wherein the free-radical photoinitiator comprises 2-hydroxy-2-methyl-1-phenyl-1-propanone.

* * * * *

UNITED STATES PATENT AND TRADEMARK OFFICE
CERTIFICATE OF CORRECTION

PATENT NO. : 6,841,079 B2 Page 1 of 2
DATED : January 11, 2005
INVENTOR(S) : Dunbar, Timothy D.

It is certified that error appears in the above-identified patent and that said Letters Patent is hereby corrected as shown below:

Column 10,
Line 2, delete "$CF_3(CF_2)20[CF(CF_3)CF_2O]_XCF(CF_3)CO_2H$" and insert
-- $CF_3(CF_2)_2O[CF(CF_3)CF_2O]_XCF(CF_3)CO_2H$ -- in place thereof.
Line 10, delete "1" and insert -- 1, -- in place thereof.
Line 43, delete "$CF_3(CF_2)_3CH_2CHI(CH_2)_gCH_2OH$" and insert -- $CF_3(CF_2)_3CH_2CHI(CH_2)_8CH_2OH$ -- in place thereof.

Column 11,
Line 22, delete "$C_7F_{15}CH_2OCH\ CH=CH_2$ (E1)" and insert
-- $C_7F_{15}CH_2OCH_2CH=CH_2$ (E1) -- in place thereof.
Line 35, delete "$C_2F_5OC_2F_4CF_2CH_2OCH_2CH=CH_2$ (E2)" and insert
-- $C_2F_5OC_2F_4OCF_2CH_2OCH_2CH=CH_2$ (E2) -- in place thereof.
Line 54, insert -- . -- following "(18kPa)".
Lines 55-56, delete "$CF_3(CF_2)_3OC_2F40CF_2CH_2OC_2H_4OCH_2CH=CH$ (E3)" and insert
-- $CF_3(CF_2)_3OC_2F_4OCF_2CH_2OC_2H_4OCH_2CH=CH_2$ (E3) -- in place thereof.

Column 12,
Line 22, insert -- : -- following "(E4)".
Lines 38-39, delete "$(CF_2)_2[CF(CF_3)CF_2O]_XCF(CF_3)CH_2OCH_2CH=CH_2$ (E5)" and insert -- $(CF_2)_2O[CF(CF_3)CF_2O]_XCF(CF_3)CH_2OCH_2CH=CH_2$ (E5) -- in place thereof.

Column 13,
Line 11, insert -- : -- following "(E4)".
Line 55, delete "ML" and insert -- mL -- in place thereof.

Column 14,
Line 23, delete "$CF_3CF_2)_7(CH_2)_gCH=CH_9$ (E8)" and insert -- $CF_3(CF_2)_7(CH_2)_9CH=CH_2$ (E8) -- in place thereof.
Line 48, delete "$CF_3(CF_2)_7(CH_2)_gCH=CH_2$" and insert -- $CF_3(CF_2)_7(CH_2)_9CH=CH_2$ -- in place thereof.

Column 15,
Lines 5-6, delete "$CF_3OC_2F_4OC_2F_4OCF_2C(O)NHCH_2CH=CH$) (E10)" and insert
-- $CF_3OC_2F_4OC_2F_4OCF_2C(O)NHCH_2CH=CH_2$ (E10) -- in place thereof.
Line 19, delete "ml/min" and insert -- mL/min -- in place thereof.

Column 16,
Line 18, insert -- : -- following "$C_8F_{17}SO_2N(CH_3)CH_2CH=CH_2$ (E12)" .
Line 40, delete "$C_8F_{17}SON(CH_2CH_3)CH\ CH=CH_9$ (E13)" and insert -- $C_8F_{17}SO_2N(CH_2CH_3)CH_2CH=CH_2$ (E13): -- in place thereof.

UNITED STATES PATENT AND TRADEMARK OFFICE
CERTIFICATE OF CORRECTION

PATENT NO. : 6,841,079 B2
DATED : January 11, 2005
INVENTOR(S) : Dunbar, Timothy D.

It is certified that error appears in the above-identified patent and that said Letters Patent is hereby corrected as shown below:

Column 19,
Line 65, delete ">18 megohms" and insert -- $\geq$18 megohms -- in place thereof.

Column 23,
Line 39, delete "(20 megaPascals))" and insert -- (20 megaPascals) -- in place thereof.
Line 52, delete "10".

Column 28,
Line 52, delete "claim 28" and insert -- claim 52 -- in place thereof.

Signed and Sealed this

Tenth Day of May, 2005

JON W. DUDAS
*Director of the United States Patent and Trademark Office*